(12) United States Patent
Tzeng et al.

(10) Patent No.: US 8,994,146 B2
(45) Date of Patent: Mar. 31, 2015

(54) METAL-INSULATOR-METAL (MIM) CAPACITOR WITHIN TOPMOST THICK INTER-METAL DIELECTRIC LAYERS

(71) Applicant: Taiwan Semiconductor Manufacturing Company, Ltd., Hsin-Chu (TW)

(72) Inventors: Kuo-Chyuan Tzeng, Chu-Pei (TW); Luan C. Tran, Tainan (TW); Chen-Jong Wang, Hsin-Chu (TW); Kuo-Chi Tu, Hsin-Chu (TW); Hsiang-Fan Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/203,166

(22) Filed: Mar. 10, 2014

(65) Prior Publication Data

US 2014/0191364 A1 Jul. 10, 2014

Related U.S. Application Data

(62) Division of application No. 13/212,922, filed on Aug. 18, 2011, now Pat. No. 8,716,100.

(51) Int. Cl.
*H01L 21/20* (2006.01)
*H01L 49/02* (2006.01)
*H01L 23/522* (2006.01)

(52) U.S. Cl.
CPC ............ *H01L 28/40* (2013.01); *H01L 23/5223* (2013.01); *H01L 28/90* (2013.01)
USPC .................................. 257/532; 257/E21.008

(58) Field of Classification Search
USPC ................. 257/296–313, 533, 532, 595–602, 257/923–924, E27.016–E27.017, 257/E27.019–E27.021, E27.023–E27.025, 257/E27.03–E27.035, E27.037–E27.038, 257/E27.041–E27.045, E27.047–E27.048, 257/E27.071, E27.09, E27.092–E27.093, 257/E27.095, E27.101, E27.114–E27.116, 257/E29.343
See application file for complete search history.

(56) References Cited

U.S. PATENT DOCUMENTS

| | | |
|---|---|---|
| 6,849,387 B2 | 2/2005 | Chiang et al. |
| 7,968,929 B2 | 6/2011 | Chinthakindi et al. |
| 2002/0195632 A1 | 12/2002 | Inoue et al. |
| 2004/0067616 A1 | 4/2004 | Hachisuka et al. |
| 2005/0032354 A1 | 2/2005 | Chu et al. |
| 2005/0082586 A1* | 4/2005 | Tu et al. .................... 257/296 |
| 2006/0234464 A1* | 10/2006 | Giraudin et al. .......... 438/386 |
| 2007/0173029 A1 | 7/2007 | Abadeer et al. |
| 2008/0239618 A1* | 10/2008 | Cremer et al. ............ 361/302 |
| 2010/0213572 A1 | 8/2010 | Ching et al. |
| 2010/0219502 A1 | 9/2010 | Shieh et al. |
| 2014/0193961 A1 | 7/2014 | Tzeng et al. |

* cited by examiner

*Primary Examiner* — Selim Ahmed
(74) *Attorney, Agent, or Firm* — Slater & Matsil, L.L.P.

(57) ABSTRACT

Embodiments of MIM capacitors may be embedded into a thick IMD layer with enough thickness (e.g., 10 KÅ~30 KÅ) to get high capacitance, which may be on top of a thinner IMD layer. MIM capacitors may be formed among three adjacent metal layers which have two thick IMD layers separating the three adjacent metal layers. Materials such as TaN or TiN are used as bottom/top electrodes & Cu barrier. The metal layer above the thick IMD layer may act as the top electrode connection. The metal layer under the thick IMD layer may act as the bottom electrode connection. The capacitor may be of different shapes such as cylindrical shape, or a concave shape. Many kinds of materials (Si3N4, ZrO2, HfO2, BST . . . etc.) can be used as the dielectric material. The MIM capacitors are formed by one or two extra masks while forming other non-capacitor logic of the circuit.

20 Claims, 25 Drawing Sheets

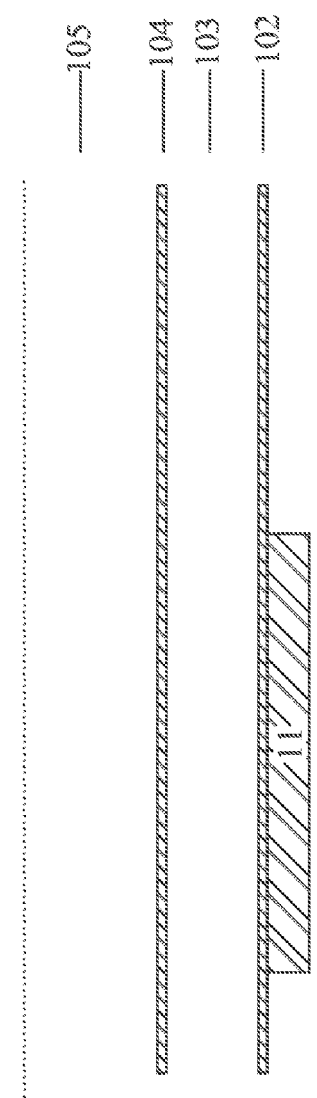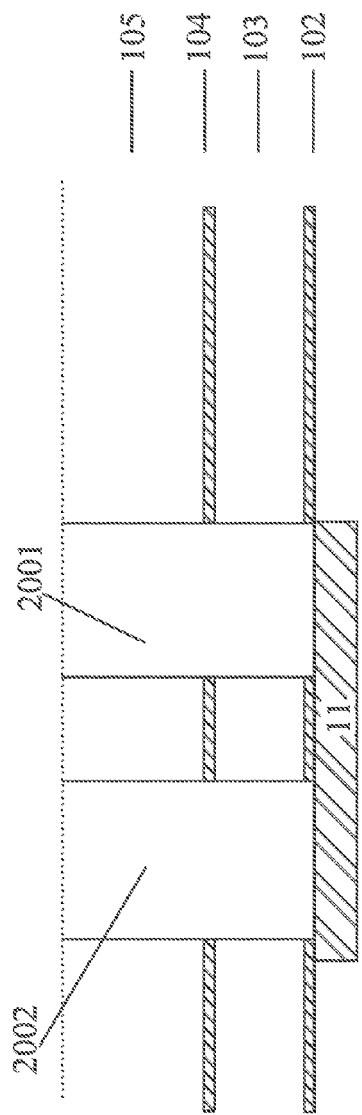

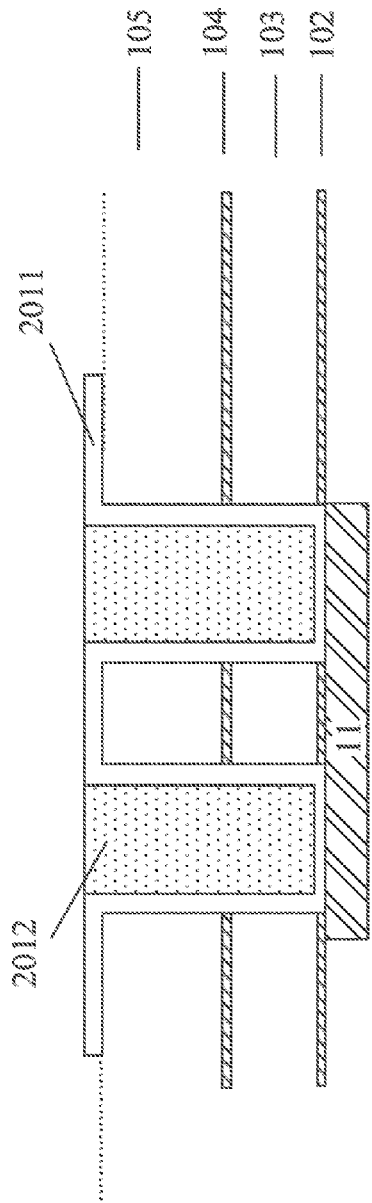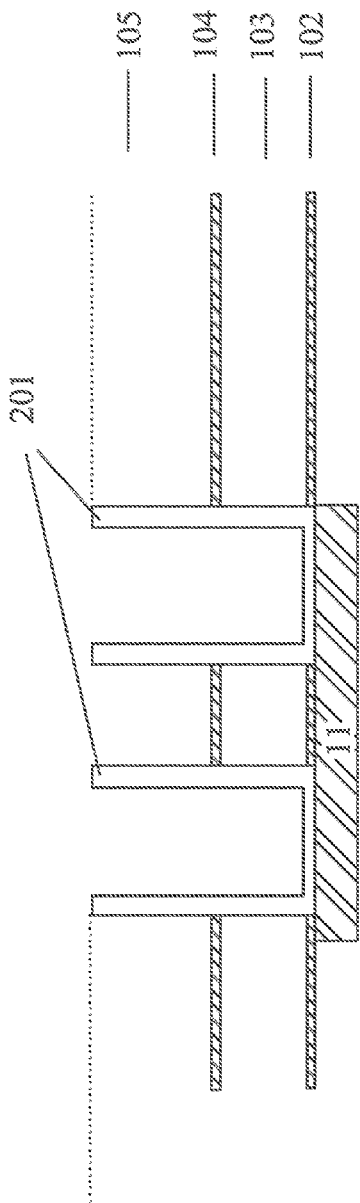

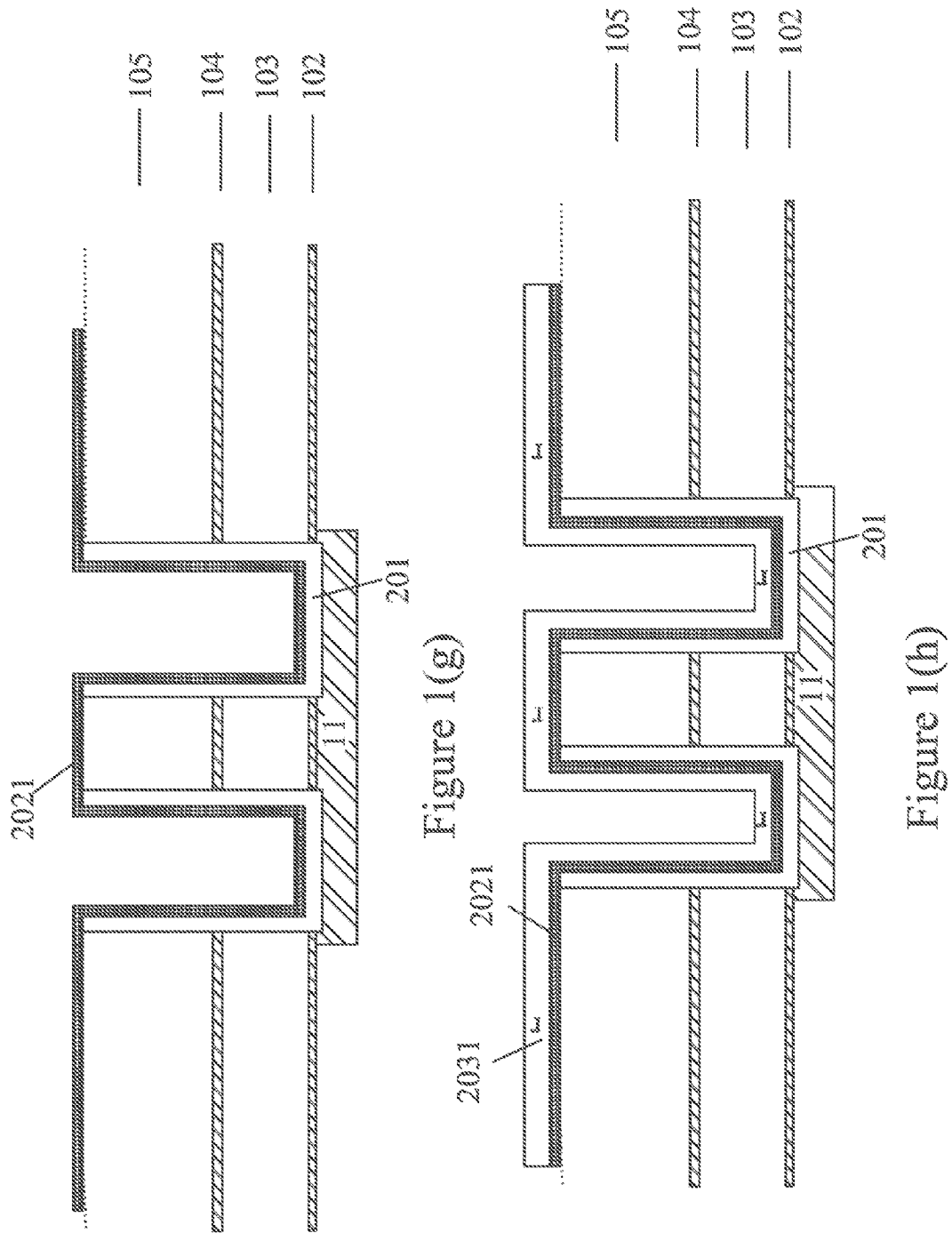

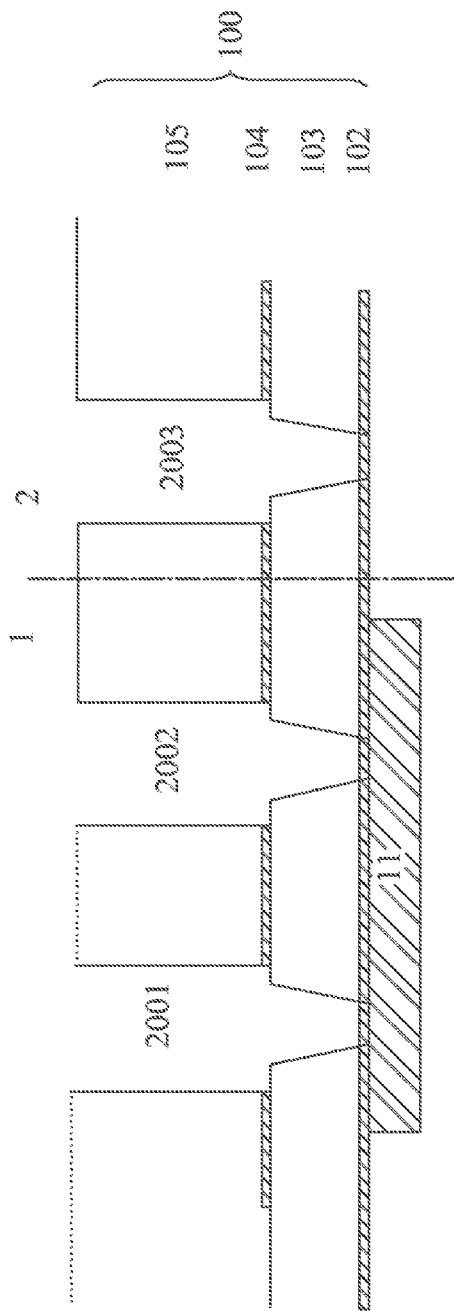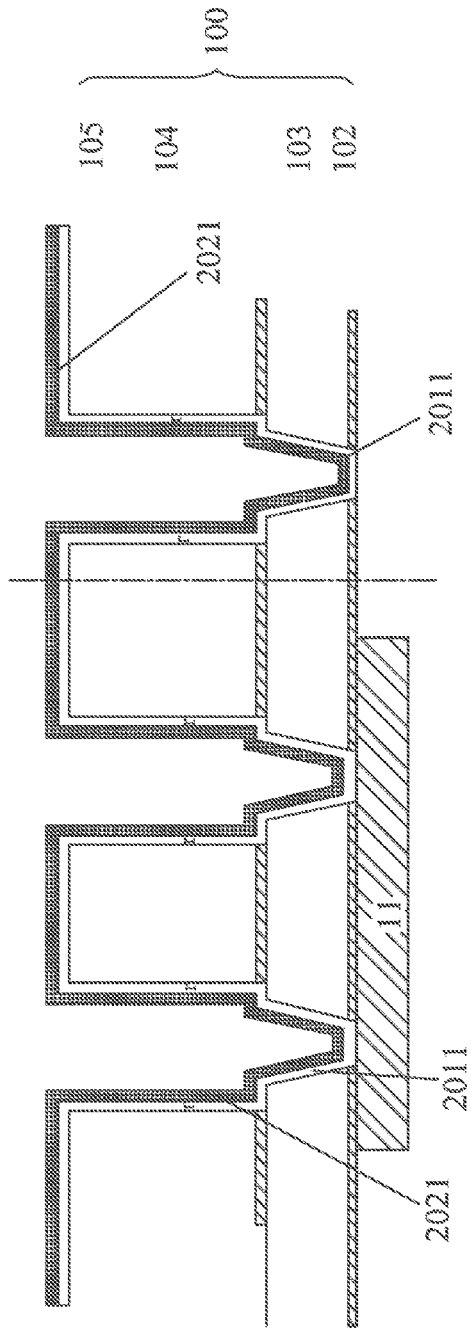

METAL-INSULATOR-METAL (MIM) CAPACITOR WITHIN TOPMOST THICK INTER-METAL DIELECTRIC LAYERS

PRIORITY CLAIM AND CROSS-REFERENCE

This application is a divisional of, and claims the benefit of, U.S. patent application Ser. No. 13/212,922, filed on Aug. 18, 2011, titled "METHOD OF FABRICATING METAL-INSULATOR-METAL (MIM) CAPACITOR WITHIN TOPMOST THICK INTER-METAL DIELECTRIC LAYERS", which is hereby incorporated herein by reference. This application is related to commonly owned and co-pending patent application Ser. No. 14/203,041, filed on Mar. 10, 2014 and entitled "METHOD OF FABRICATING METAL-INSULATOR-METAL (MIM) CAPACITOR WITHIN TOPMOST THICK INTER-METAL DIELECTRIC LAYERS," which is a continuation of U.S. patent application Ser. No. 13/212,922, filed on Aug. 18, 2011 and which application is incorporated herein by reference.

BACKGROUND

Complementary metal-oxide-semiconductor (CMOS) is a technology for constructing digital integrated circuits (IC) such as microprocessors, microcontrollers, and others, or analog circuits such as image sensors, data converters, and transceivers for many types of communication. An IC may comprise digital logic parts such as transistors, plus other components such as resistors and capacitors, connected together by metal layers.

Many kinds of capacitors such as metal-oxide-semiconductor (MOS) capacitors, PN junction capacitors, polysilicon-insulator-polysilicon (PIP) capacitors, and metal-insulator-metal (MIM) capacitors are used in semiconductor devices. In particular, the MIM capacitor offers reduced electrode resistance with wide ranges of applications.

A semiconductor chip may comprise of a plurality of contacts interconnected by multiple metal layers, which are separated by layers of insulating materials forming inter-metal dielectric (IMD) layers. Interconnections between different metal layers are made by vias, which go through insulating layers. Vias allow for communication between interconnects of other metal layers or directly with the semiconductor devices in the substrate. Typical chips may comprise of three or more metal layers, followed by a final passivation layer. The final passivation layer may be used for protecting the CMOS from mechanical abrasion during probe and packaging and to provide a barrier to contaminants. After the final passivation layer, the bond pads for input/output will be opened, followed by the normal post-fabrication process such as wafer probe, die separation, and packaging.

One way to fabricate layers of metal for a chip involves a damascene process. Damascene means formation of a patterned layer imbedded on and in another layer such that the top surfaces of the two layers are coplanar. An IMD is deposited either directly on a substrate, or on top of another existing layer of metal. Once the IMD is deposited, portions of the IMD may be etched away to form recessed features, such as trenches and vias, which can connect different regions of the chip and accommodate the conductive lines. A damascene process which creates either only trenches or vias is known as a single damascene process. A damascene process which creates both trenches and vias at once is known as a dual damascene process.

Damascene and dual-damascene processes use lower resistance metals (e.g. copper) to form many metal elements (e.g. lines, interconnects, and the like) instead of the conventionally used aluminum. A thin barrier film is used to prevent copper diffusion into the dielectric. As the number of interconnect levels increases, planarization of the previous layers is required to ensure a flat surface prior to subsequent lithography. Chemical mechanical planarization (CMP) is the primary processing method to achieve such planarization although dry etch back is still used sometimes.

MIM capacitors may be formed in different shapes such as cylindrical shape, a concave shape, a stacked shape, and so forth. Some current MIM capacitor fabrication method may have undesired impact on logic process like backend RC model change, IR drop along tall via and process reliability concern. There is a continuing need in the semiconductor device processing art for improved MIM capacitor structures and manufacturing processes.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1(a)-1(l) are schematic views of an illustrative embodiment of method steps for forming an MIM capacitor between two adjacent metal layers wherein the top and bottom electrodes are connected to plates at a first and a second metal layer respectively;

FIGS. 3(a)-3(h) are schematic views of an illustrative embodiment of method steps for forming an MIM capacitor among three adjacent layers, wherein the bottom electrode is formed within a plurality of via and metal contact openings.

DETAILED DESCRIPTION

The making and forming of the present exemplary embodiments are discussed in detail below. It should be appreciated, however, that embodiments of the present disclosure provide many applicable concepts that can be embodied in a wide variety of specific contexts. The specific embodiments discussed are merely illustrative of specific ways to make and use the invention, and do not limit the scope of the applications.

The present disclosure will be described with respect to exemplary embodiments in a specific context, namely methods of fabricating metal-insulator-metal (MIM) capacitors and MIM capacitors fabricated by the methods.

Figure 1A:
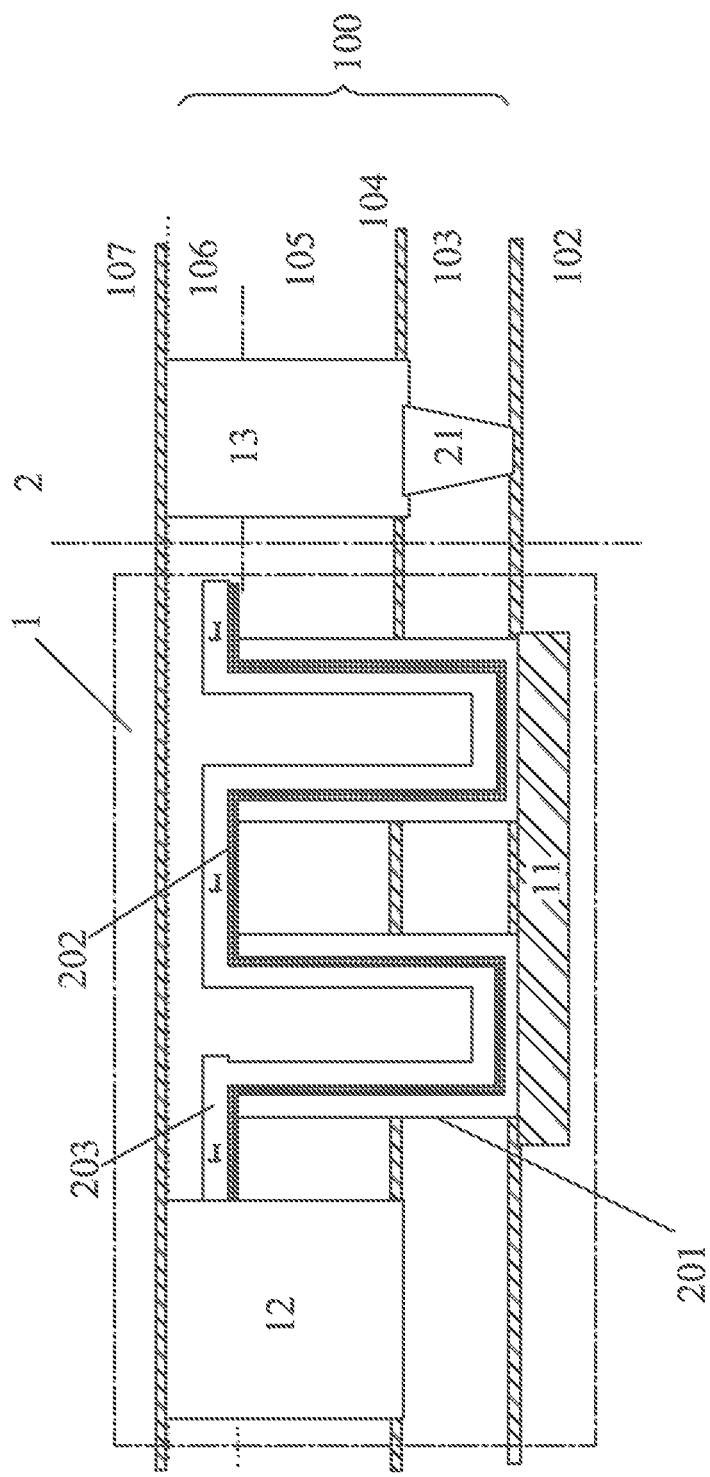

FIG. 1(a) illustrates an exemplary MIM capacitor 1 formed by an embodiment process illustrated in FIGS. 1(b)-(l). The exemplary MIM capacitor is formed between two adjacent metal layers of an IC with a thick IMD layer (e.g., 10 KÅ~30 KÅ). The two adjacent metal layers with a thick IMD layer may illustratively be the top two metal layers of an IC, next to the final passivation layer.

The so formed MIM capacitors contained in the top two metal layers have high capacitance density. For example, illustrative embodiments of MIM capacitors can have capacitance density in the range of 60~200 fF/$\mu m^2$. The resulting capacitors do not change any film scheme of CMOS logic process and therefore have no spice model shift, chip performance degradation and process reliability issues. Moreover, the top metal layer thickness is relatively stable with different generations of technologies, so the embedded MIM capacitors can be used for many generations of advanced logic technology.

FIG. 1(a) illustrates an exemplary MIM capacitor 1 formed together with other logic 2 of a circuit. The MIM capacitor is formed within the IMD layer between two interconnect metal layers. The MIM capacitor 1 may comprise a bottom electrode 201 and upper electrode 203 formed of TaN or TiN, and an intervening high-k dielectric material 202. A bottom electrode pick-up 11 is formed in a first metal layer and a top electrode pick-up 12 is formed in a next metal layer. Advantageously, the MIM capacitor is formed between the topmost and the next-to-topmost metal layers because these metal layers have a sufficiently thick inter-metal dielectric (IMD) layer which allows for the MIM capacitor to be manufactured therein, without adding additional IMD sub-layers, relative to the standard logic CMOS process flow.

FIG. 1(a) is only for illustrative purposes and are not limiting. For example, there may be more than one MIM capacitor so formed by the illustrative process. The size and position of the metal contacts 11, 12, and 13, are for illustrative purposes and are not limiting. There may be more than one metal contact in the logic part rather than the one metal contact 13 as shown. The size of each sub-layers such as 102, 103, 104, 105, 106, and 107 are only for illustrative purposes and are not limiting. The MIM capacitor 1 may be of different shapes such as cylindrical shape, or a concave shape.

Still referring to FIG. 1(a), the bottom electrode 201, the dielectric material 202, and the top electrode 203 are embedded within an IMD layer 100 comprising: a stop sub-layer 102 used to prevent Cu out diffusion and also as a via etching stop layer and may be formed by SIC or SIN material; a first IMD sub-layer 103 formed of dielectric insulating layers such as silicon oxide based doped or un-doped materials, but preferably undoped silicate glass (USG) for enhanced structural stability, or fluorinated silicate glass (FSG) for structural stability; a second stop sub-layer 104 to prevent Cu out diffusion and also as a via etching stop layer; a second IMD sub-layer 105; followed by a third IMD sub-layer 106; further followed by a stop sub-layer 107.

A process of forming the illustrative MIM capacitor 1 shown in FIG. 1(a) is shown in FIGS. 1(b)-(l). In FIG. 1(b), the illustrative process starts with forming a metal contact 11 (sometimes also referred to as a bottom electrode pick-up) at the metal layer next to the top-most metal layer; continues with forming a first stop layer 102 by depositing SiC or SIN material. A first IMD sub-layer 103 is formed by depositing IMD materials such as USG oxide film, followed by forming a second stop sub-layer 104 by depositing SiC or SIN materials. Next a second IMD sub-layer 105 is formed by depositing materials such as USG oxide film. Those sub-layers 102, 103, 104, 105 are part of the IMD layer 100 between the top two metal layers, and they are deposited by methods including LPCVD, PECVD, or HDP-CVD. An advantageous feature of the present embodiment is that IMD layer 100 (comprising etch stop layer 102 and 104 and dielectric layers 103 and 106) is a standard layer that is typically employed in CMOS logic processes. Hence, advantageously, no additional IMD sub-layers or processes are required to integrate the illustrative process into standard CMOS process flows.

Another advantageous feature to placing the MIM capacitor in the topmost IMD layer is that the topmost IMD layer is typically much thicker than lower IMD layers (ranging from perhaps 10,000 Å to 30,000 Å). This means that a MIM capacitor structure, having sufficient surface area for the desired capacitance, can be formed within the IMD layer, without the need to add thicker or additional IMD layers beyond those that are traditionally employed in the manufacture of CMOS logic devices.

FIG. 1(c) illustrates two openings 2001 and 2002 are formed within the layers 102 to 105, on top of the metal contact 11 by photolithography using an extra mask A (not shown). This is referred to as an "extra mask" because this step of forming opening 2001 and 2002 requires a mask step that is not part of a CMOS back end of line (BEOL) process flow for other non-capacitor logic parts. The openings 2001 and 2002 are in direct contact with the metal contact 11. FIG. 1(c) is a cross-section view, and the openings 2001 and 2002 may be shaped as a cup (i.e., openings 2001 and 2002 may have a substantially circular shape when seen from above). There may be more than two openings. The number, the position, the size, the width, and the shape of the openings 2001 and 2002 are only for illustrative purposes only, but are not limiting.

Figure 1D:
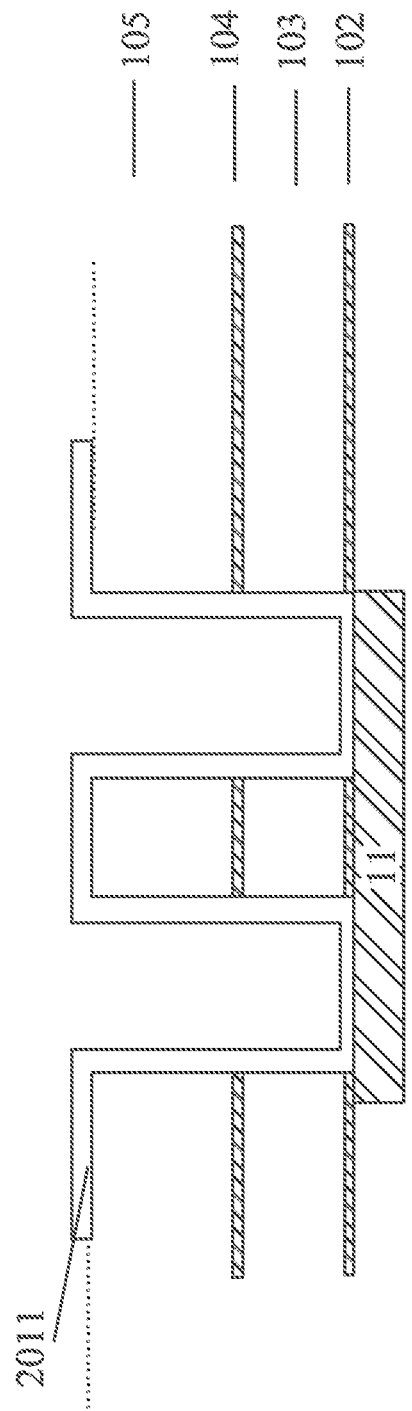

FIG. 1(d) illustrates bottom electrode material 2011 is deposited at the bottom and along the side wall of the openings 2001 and 2002, and on top of the surface of the sub-layer 105. The material 2011 deposited at the bottom of the openings 2001 and 2002 is in contact with the metal contact 11 forming an electrical contact path. The material 2011 may be conductive materials such as TaN or TiN, or silicided metal nitride such as TaSiN, TiSiN, and WSiN. There may be multiple sub-layers (not shown) comprising the conductive materials.

FIG. 1(e) illustrates photo resist coating material 2012 is deposited on top of the bottom electrode material 2011, filling the openings 2001 and 2002, and on top of the surface of the sub-layer 105. This photo resist coating material is then removed from the surface (via an etch back or similar process) such that photo resist coating material 2012 remains only in openings 2001 and 2002, as shown in FIG. 1(e). Afterwards, the bottom electrode material 2011 is etched back from the top surface of sub-layer 105 to form the bottom electrode 201 shown in FIG. 1(f). Photo resist coating material 2012 covers and hence protects the bottom electrode material in the trenches, thus allowing for the removal of bottom electrode material 2011 only on the exposed top surfaces. Alternatively, the bottom electrode material could 201 may be removed by a chemical mechanical planarization (CMP).

Figure 1I:
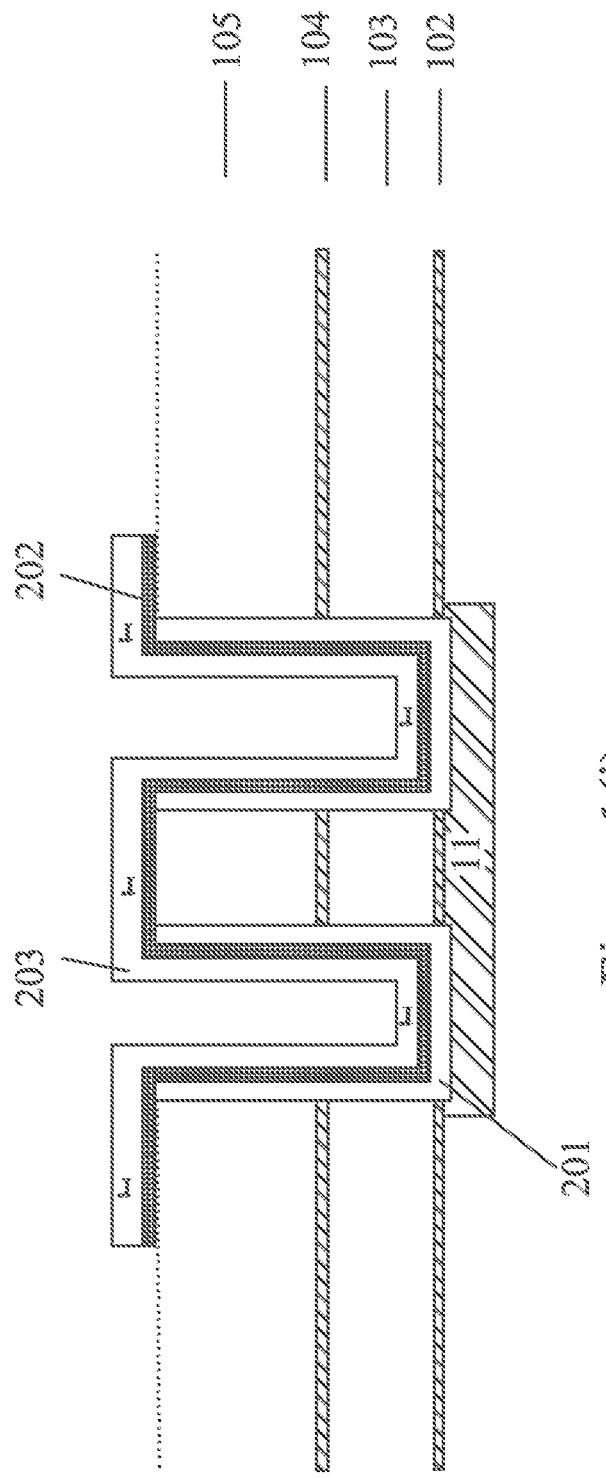
Figure 1G:
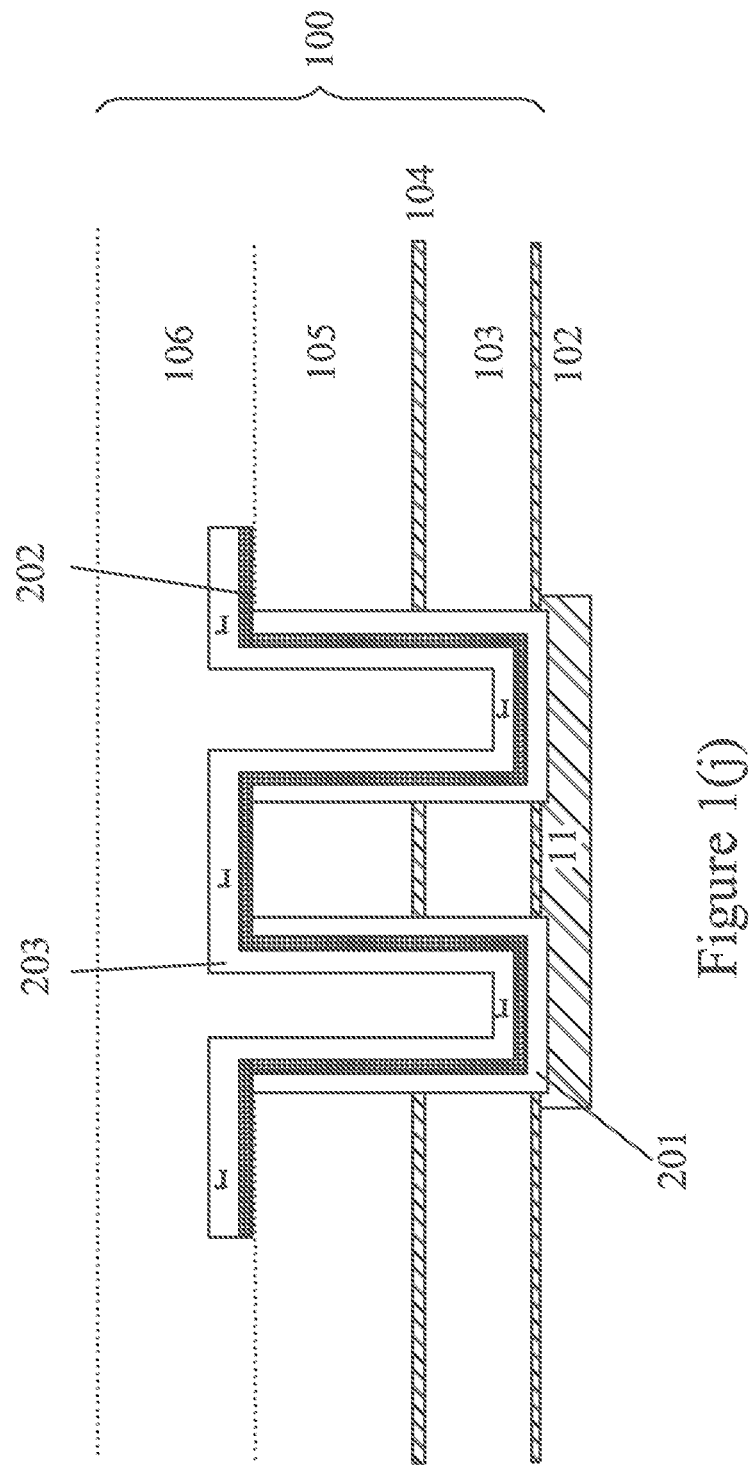

FIG. 1(g) illustrates a layer of capacitor dielectric 2021 is deposited on top of the bottom electrode 201 at the bottom and along the side wall of the openings 2001 and 2002, and on top of the surface of the sub-layer 105 by means including ALD, LPCVD, PECVD, and ALCVD. The material may include any capacitor dielectric such as $SiO_2$, metal nitrides, such as silicon nitride (e.g., $Si_3N_4$) or high dielectric constant (high-k) materials such as $TiO_2$, $Ta_2O_5$, $ZrO_2$, including rare earth oxides such as $Y_2O_3$, $La_2O_5$, $HfO_2$, and their aluminates and silicates. It will be appreciated that the thickness of the capacitor dielectric layer 202 varies depending on the dielectric material and the desired capacitance. Afterwards, a layer of top electrode layer 2031 is then deposited over the capacitor dielectric layer 2021, as shown in FIG. 1(h). The upper metal electrode layer 2031 preferably includes at least one conductive layer, for example including the same preferred materials deposited in the bottom electrode layer 201. The overall thickness of the upper electrode layer 2031 is preferably about the same thickness or preferably thicker than the bottom electrode layer 201 thickness, depending on the application.

FIG. 1(i) illustrates top electrode 203 and capacitor dielectric layer 202 are formed using an extra mask B by photolithography techniques. Again, this refers to the fact that the mask used to define the edges of top electrode 203 is an "extra" mask step that is not otherwise required by a typical CMOS process flow.

FIG. 1(j) illustrates further to form a sub-layer of IMD 106 on top of the top electrode layer 203 and on top of the sub-layer 105, by using IMD materials such as USG oxide film. The sub-layer 106 may have a flat surface formed by CMP.

Figure 1K:
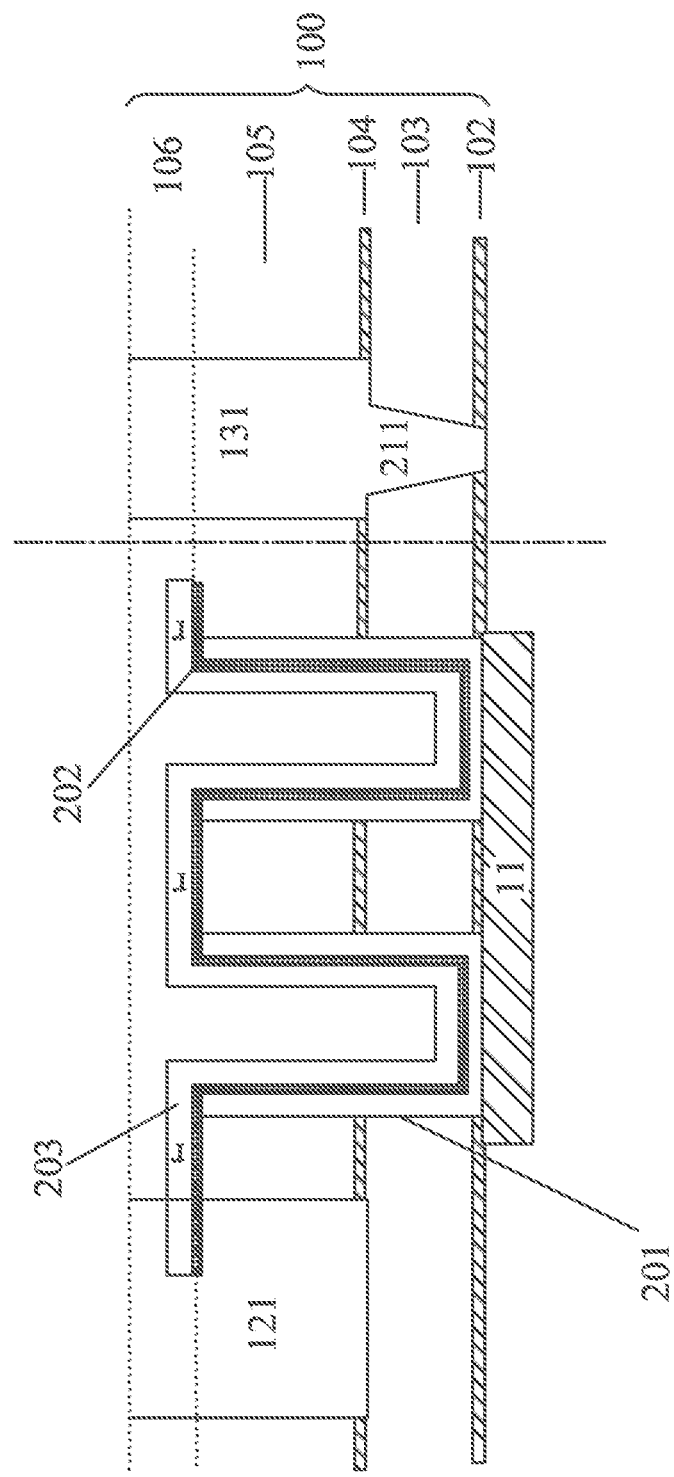

FIG. 1(k) illustrates next to form other needed via and metal openings such as via opening 211, metal opening 131 and 121 within the IMD layer 100. The via opening 211 may be positioned between two stop sub-layer 102 and 104. The metal openings 121 and 131 are formed starting from the sub-layer 104 and all the way to layer 106. The processes for forming via and metal openings, commonly referred to as damascene or dual damascene processes, are well known to those skilled in the art and hence are not repeated herein. An advantageous feature of the present invention is that via opening 211 and subsequently formed via 21 can be of the same dimensions as a via used in a standard CMOS logic process flow. It is not necessary to elongate the via because the entire MIM capacitor 1 can be formed within the dimensions of the IMD layer 100. This is an advantageous consequence of forming MIM capacitor 1 in the topmost IMD layer.

Figure 1L:
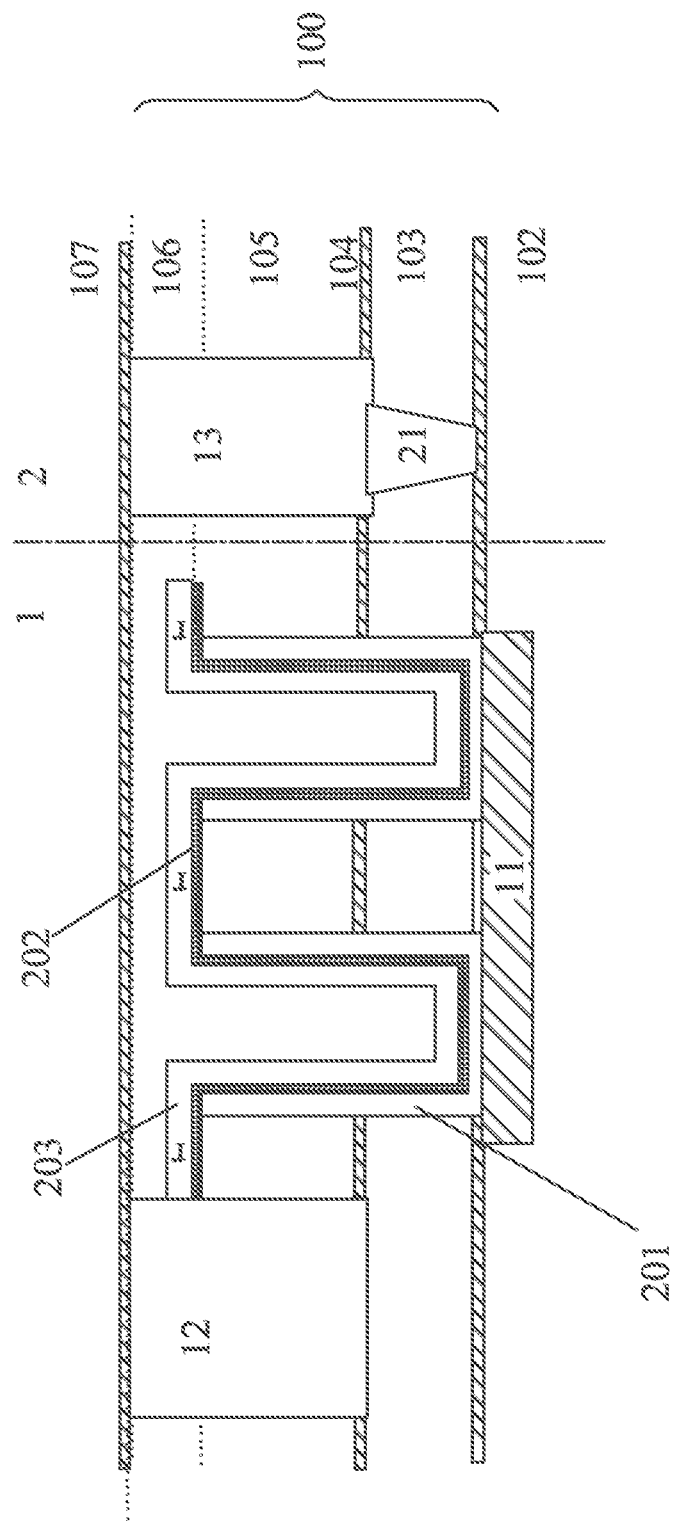

As shown in FIG. 1(l), metal materials are filled into the openings 211, 121, and 131 to form via 21 and metal contacts 12 and 13. Metal contact 13 is used for normal circuit functions of 13 and is not part of the MIM capacitor. Metal contact 12 used as to the top plate pick-up for the MIM capacitor. Next an additional stop layer 107 is formed. Further fabrication steps such as forming additional IMD layers or passivation layer may be formed.

An illustrative process shown in FIG. 1(b)-(l) may form an exemplary MIM capacitor 1 shown in FIG. 1(a). The exemplary MIM capacitor 1 is formed between a metal layer next to the top-most metal layer, and the top-most metal layer, which contain a thick IMD layer. The MIM capacitor 1 is formed by using two extra masks, during the same process when logic circuitry and other connections of the CMOS circuit is formed without any additional process.

Other illustrative embodiments of MIM capacitors may be formed among three adjacent metal layers of a chip which have two thick IMD layers, e.g., 10 KÅ~30 KÅ, separating the three adjacent metal layers, as shown in FIG. 2 and FIG. 3. The three adjacent metal layers with a thick IMD layer may illustratively be the top three metal layers of an IC, next to the final passivation layer, so that so formed MIM capacitors have high capacitance density and do not change any film scheme of CMOS logic process and therefore have no spice model shift.

Figure 2A:
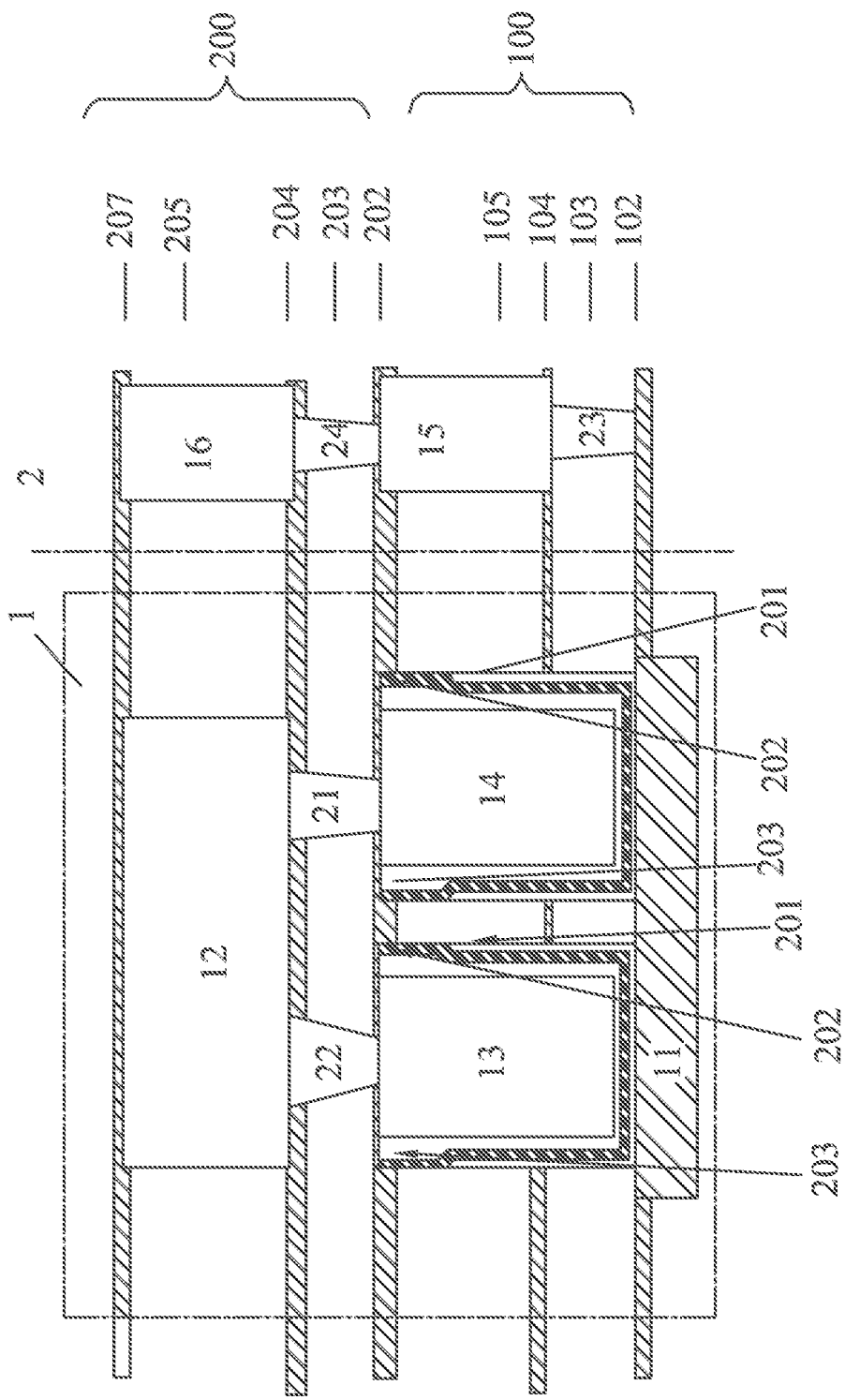
FIGS. 2(a)-2(i) are schematic views of an illustrative embodiment of method steps for forming an MIM capacitor among three adjacent layers.

FIG. 2(a) illustrates another exemplary MIM capacitor 1 formed together with other logic 2 of a circuit by a process shown in FIG. 2(b)-(i). The MIM capacitor 1 is formed within the IMD layers 200 and 100 which separate three metal layers. The MIM capacitor 1 may comprise a bottom electrode 201 and upper electrode 203 formed of TaN or TiN, and an intervening high-k dielectric material 202. A bottom electrode pick-up 11 is formed in a first metal layer and a top electrode pick-up 12 is formed in a second metal layer. Advantageously, the second metal layer is the topmost and the first metal layer is two layers down from the topmost metal layer because these metal layers have a sufficiently thick inter-metal dielectric (IMD) layer which allows for the MIM capacitor to be manufactured therein, without adding additional IMD sub-layers, relative to the standard logic CMOS process flow. Many kinds of materials (Si3N4, ZrO2, HfO2, BST . . . etc.) can be used as the dielectric material 202 of the MIM capacitor.

FIG. 2(a) is only for illustrative purposes and are not limiting. For example, there may be more than one MIM capacitor so formed by the illustrative process. The size and position of the metal contacts 11, 12, 13, 14, 15, and 16 are for illustrative purposes and are not limiting. There may be more than two metal contacts in the logic part rather than the metal contacts 15 and 16 as shown. The size of each sub-layers such as 102, 103, 104, 105, 202-207 is only for illustrative purposes and are not limiting. The MIM capacitor 1 may be of different shapes such as cylindrical shape, or a concave shape. There may be one bottom electrode 201 and one top electrode 203 rather than two 201 and 203 as shown.

Still referring to FIG. 2(a), the bottom electrode 201, the dielectric material 202, and the top electrode 203 are embedded within an IMD layer 100 comprising: a stop sub-layer 102 used to prevent Cu out diffusion and also as a via etching stop layer and which may be formed of SIC or SIN material; a first IMD sub-layer 103 formed of dielectric insulating layers such as silicon oxide based doped or un-doped materials, but preferably undoped silicate glass (USG) for enhanced structural stability, or fluorinated silicate glass (FSG) for structural stability; a second stop sub-layer 104 to prevent Cu out diffusion and also as a via etching stop layer; and a second IMD sub-layer 105.

Figure 2B:
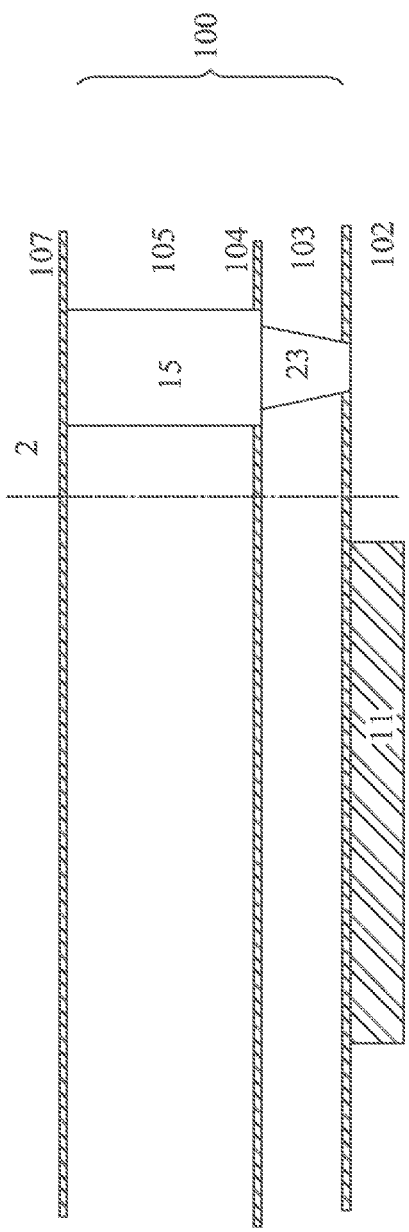

The MIM capacitor 1 in FIG. 2(a) may be fabricated by an illustrative process shown in FIG. 2(b)-(i). In FIG. 2(b), the illustrative process starts with forming a metal contact 11 (sometimes also referred to as a bottom electrode pick-up) at a metal layer that is two layers down from the topmost metal layer; continues with forming a first stop layer 102 by depositing, e.g., SiC or SIN. A first IMD sub-layer 103 is formed by depositing IMD materials such as USG oxide film, followed by forming a second stop sub-layer 104 by depositing SiC or SIN materials. Next a second IMD sub-layer 105 is formed by depositing materials such as USG oxide film, followed by an additional stop layer 107. Those sub-layers 102, 103, 104, 105 are part of the IMD layer 100 between the two metal layers next to the topmost metal layer, and they are deposited by methods including LPCVD, PECVD, or HDP-CVD. An advantageous feature of the present embodiment is that IMD layer 100 (comprising etch stop layer 102 and 104 and dielectric layers 103 and 105) is a standard layer that is typically employed in CMOS logic processes. Hence, advantageously, no additional IMD sub-layers or processes are required to integrate the illustrative process into standard CMOS process flows. Afterwards, via 23 and metal contact 15 within the layer 100 may be formed using the conventional damascene and dual-damascene processes, wherein the via 23 and metal contact 15 are for the non-capacitor logic part of the circuit.

Figure 2C:
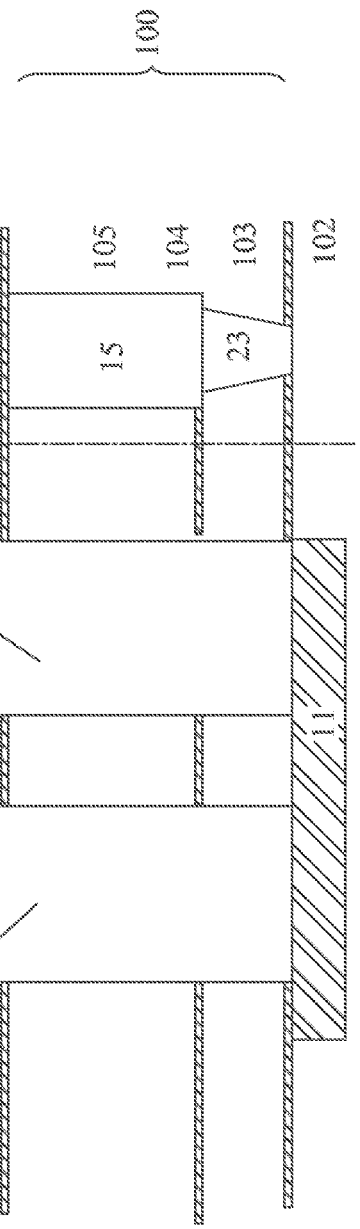

FIG. 2(c) illustrates two openings 2001 and 2002 formed within the layers 102 to 107, on top of the metal contact 11 by photolithography using an extra mask A (not shown). This is referred to as an "extra mask" because this step of forming opening 2001 and 2002 requires a mask step that is not part of a CMOS back end of line (BEOL) process flow for other non-capacitor logic parts. The openings 2001 and 2002 are in direct contact with the metal contact 11. FIG. 2(c) is a cross-section view, and the openings 2001 and 2002 may be shaped as a cup (i.e., openings 2001 and 2002 may have a substantially circular shape when seen from above). There may be more than two openings. The number, the position, the size, the width, and the shape of the openings 2001 and 2002 are only for illustrative purposes only, but are not limiting.

Figure 2D:
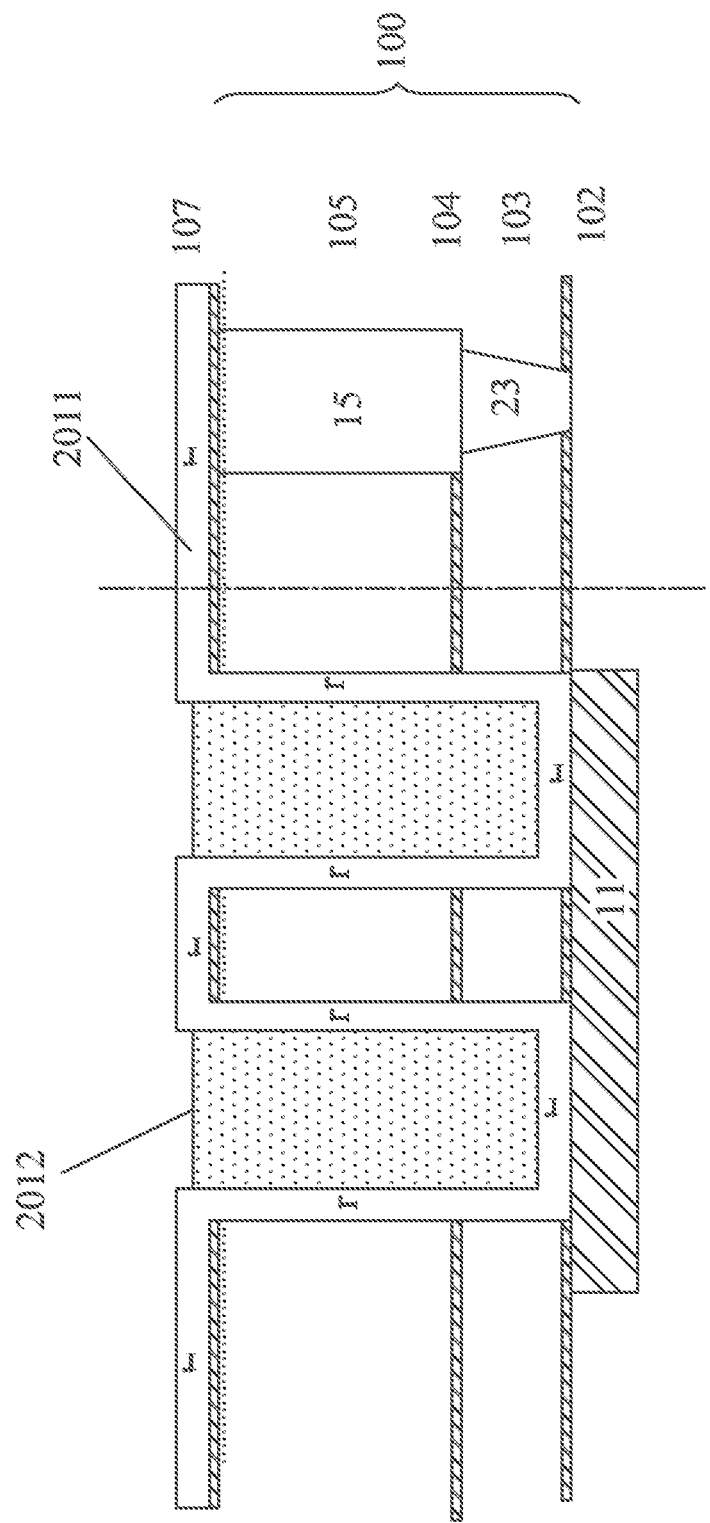
Figure 2E:
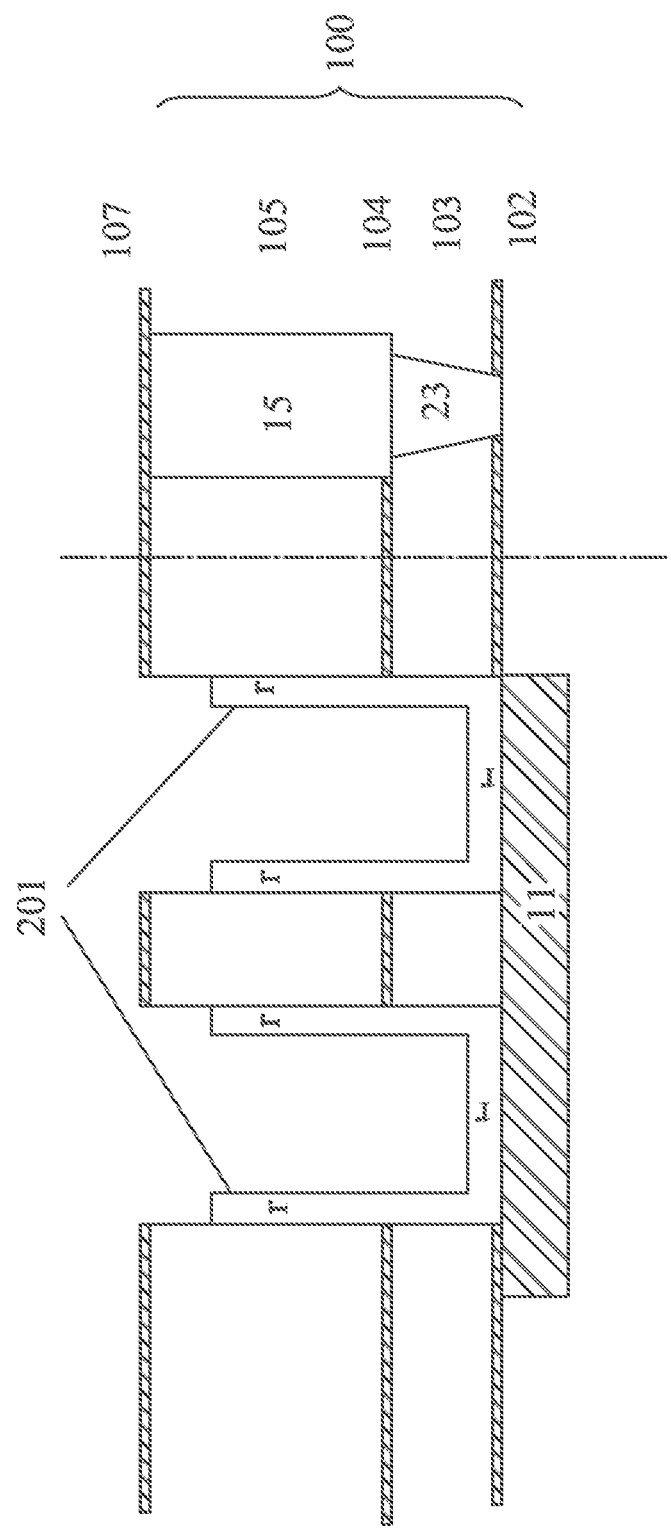

FIG. 2(d) illustrates bottom electrode material 2011 is deposited at the bottom and along the side walls of the openings 2001 and 2002, and on top of the surface of the sub-layer 107. The material 2011 deposited at the bottom of the openings 2001 and 2002 is in contact with the metal contact 11 forming an electrical contact path. The material 2011 may be conductive materials such as TaN or TiN, or silicided metal nitride such as TaSiN, TiSiN, and WSiN. There may be multiple sub-layers (not shown) comprising the conductive materials. Afterwards, photo resist coating material 2012 is deposited on top of the bottom electrode material 2011, filling the openings 2001 and 2002. This photo resist coating material is then removed from the to surface (via an etch back or similar process) such that photo resist coating material 2012 remains only in opening 2001 and 2002, as shown in FIG. 2(d). Next, the bottom electrode material 2011 is etched back from the top surface of sub-layer 107 to form the bottom electrode 201 shown in FIG. 2(e). There are two parts of bottom electrode 201 shown in FIG. 2(e), which is only for illustration purposes. There may be any other number of bottom electrodes 201 in a MIM capacitor. Photo resist coating material 2012 covers and hence protects the bottom electrode material in the trenches, thus allowing for the removal of bottom electrode material 2011 only on the exposed top surfaces.

Figure 2F:
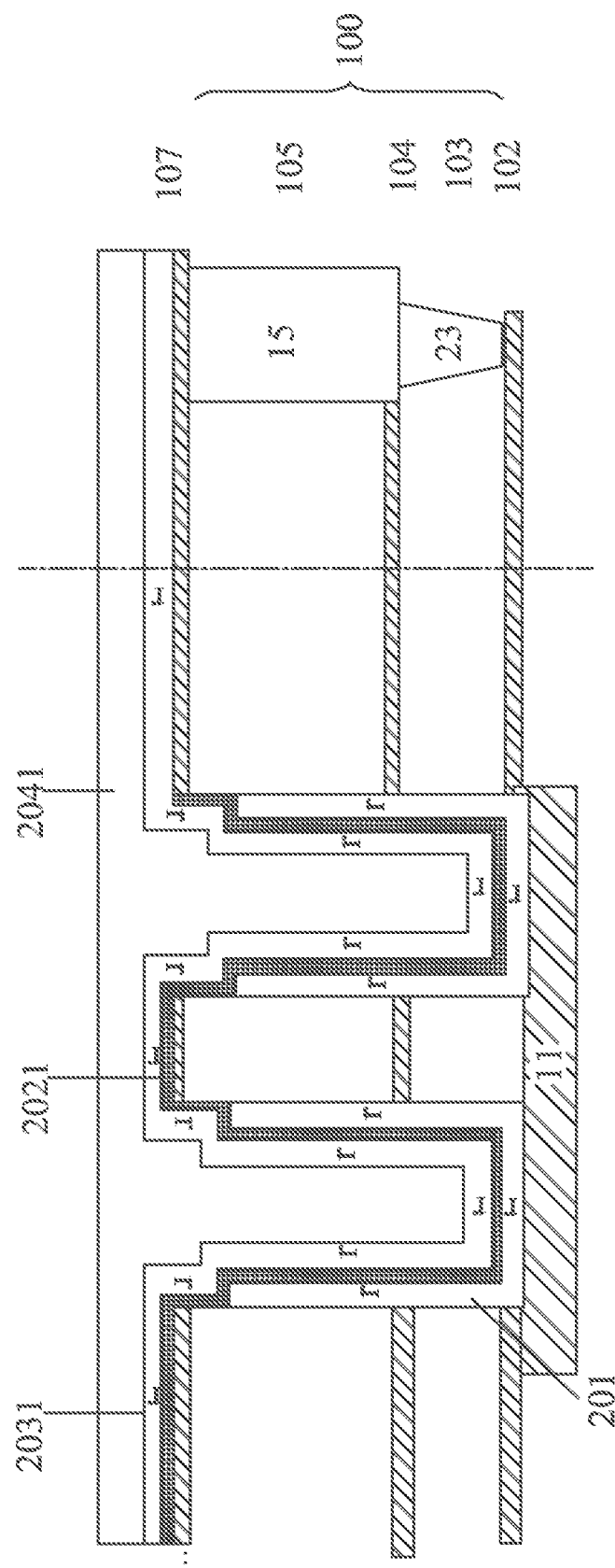

FIG. 2(f) illustrates a layer of capacitor dielectric 2021 is deposited on top of the bottom electrode 201 at the bottom and along the side wall of the openings 2001 and 2002, and on top of the surface of the sub-layer 107 by means including ALD, LPCVD, PECVD, and ALCVD. The material may include any capacitor dielectric such as $SiO_2$, metal nitrides, such as silicon nitride (e.g., $Si_3N_4$) or high dielectric constant (high-k) materials such as $TiO_2$, $Ta_2O_5$, $ZrO_2$, including rare earth oxides such as $Y_2O_3$, $La_2O_5$, $HfO_2$, and their aluminates and silicates. It will be appreciated that the thickness of the capacitor dielectric layer 202 varies depending on the dielectric material and the desired capacitance. Afterwards, a layer of top electrode layer 2031 is then deposited over the capacitor dielectric layer 2021, as shown in FIG. 2(f), by sputter deposition techniques. The upper metal electrode layer 2031 preferably includes at least one conductive layer, for example including the same preferred materials deposited in the bottom electrode layer 201. The overall thickness of the upper electrode layer 2031 is preferably about the same thickness or preferably thicker than the bottom electrode layer 201 thickness, depending on the application. Additional metal material Cu 2041 is used to fill the remaining part of the openings and on top of the top electrode deposit 2031, as shown in FIG. 2(f).

Figure 2G:
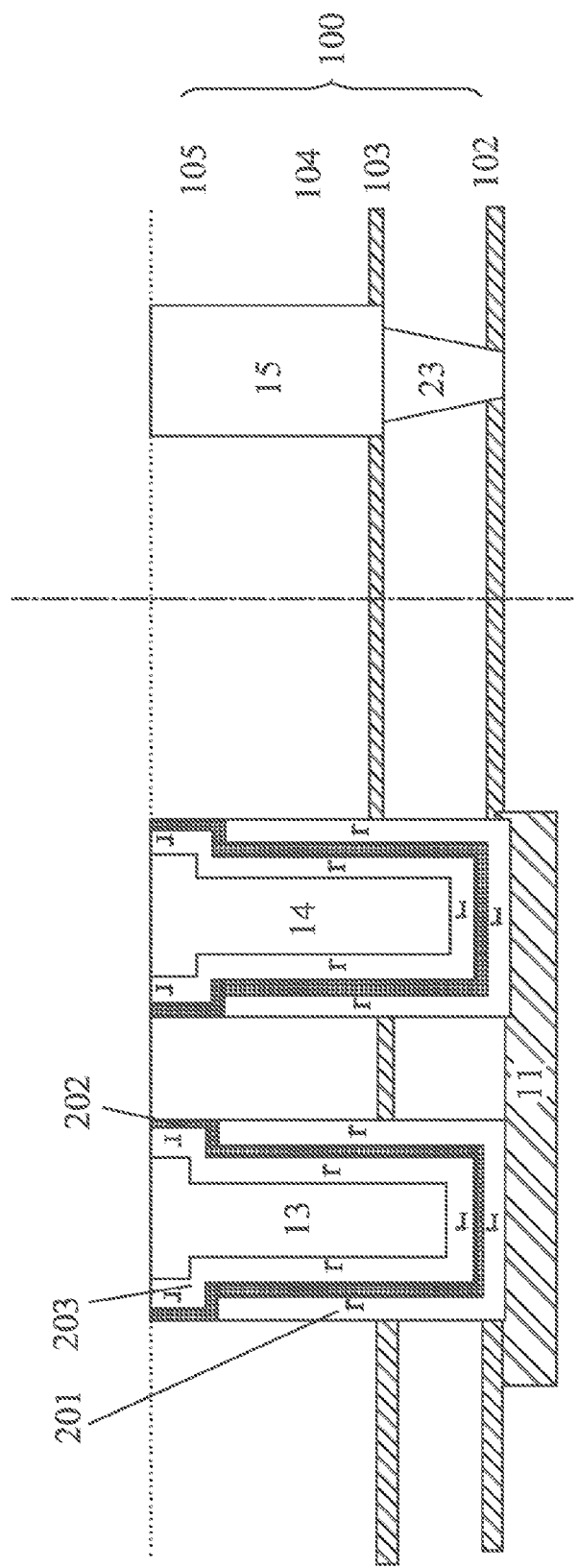

The so formed capacitor dielectric 2021 layer, top electrode layer 2031, additional metal material Cu 2041 may be removed by a chemical mechanical planarization (CMP) to form the 202 Hi-k layer and the 203 top electrode for the MIM capacitor, in addition to the metal contacts 13 and 14 as shown in FIG. 2(g). The rest of the stop layer 107 SIC is removed as well, as shown in FIG. 2(g). There is no extra mask needed in this process and the process from now on. Therefore only one extra mask is used in forming the illustrative MIM capacitor shown in FIG. 2.

Figure 2H:
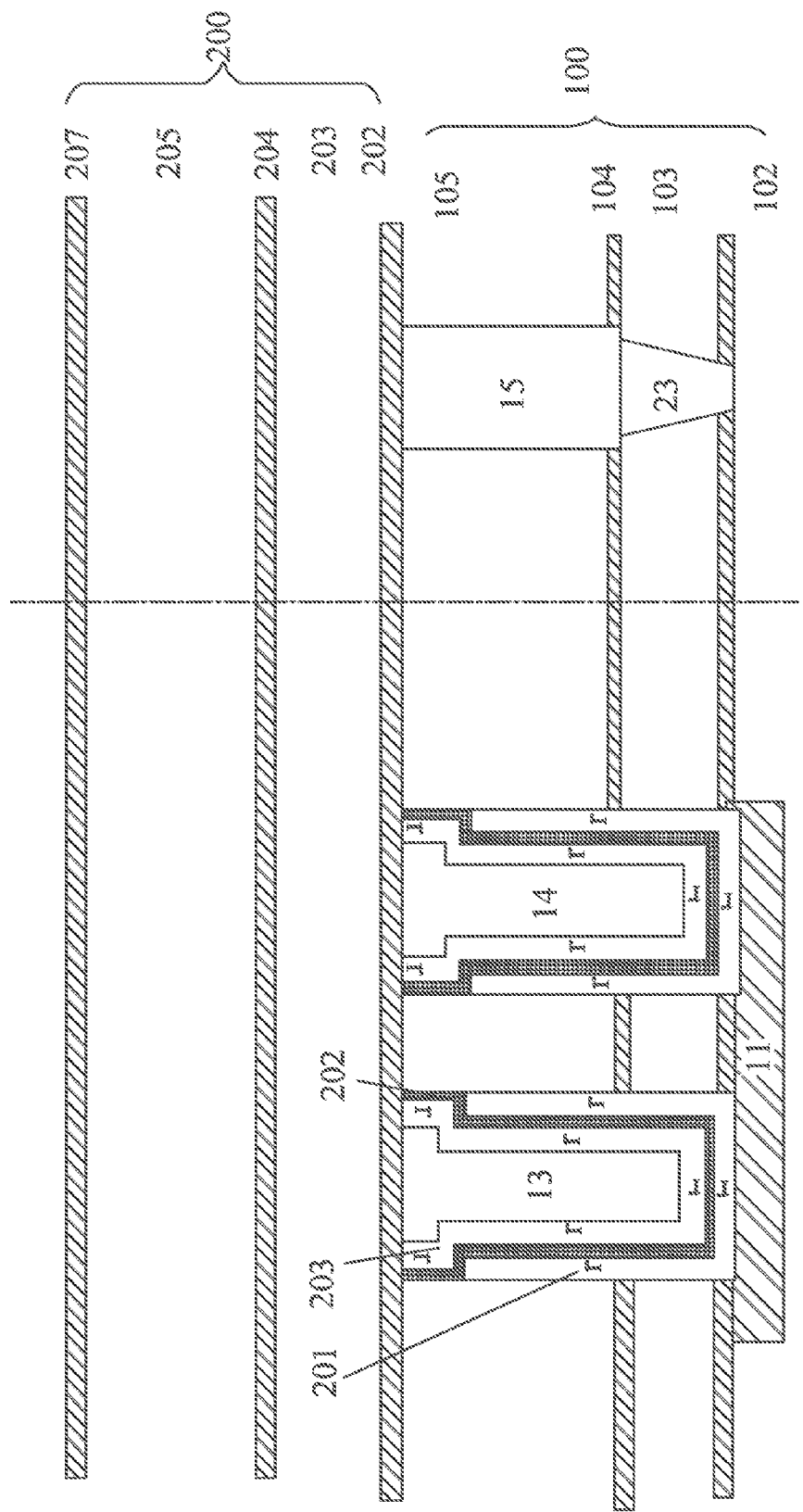

As shown in FIG. 2(h), the process for fabricating the MIM capacitor in FIG. 2 may proceed further by forming the first stop sub-layer 202 of the IMD layer 200, which covers the metal 13, 14, and 15, then forming a sub-layer of IMD 203 by using IMD materials such as USG oxide film; followed by forming a second stop layer 204, another sub-layer of IMD 205, and followed by a sub-layer of stop layer 207, using procedures and materials described previously as for the IMD layer 100. While in the illustrated embodiments, non-capacitor contact 15 and via 23 are formed prior to forming the MIM capacitor structure, in other embodiments, the MIM capacitor could be formed first, followed by forming contact 15 and via 23.

Figure 2I:
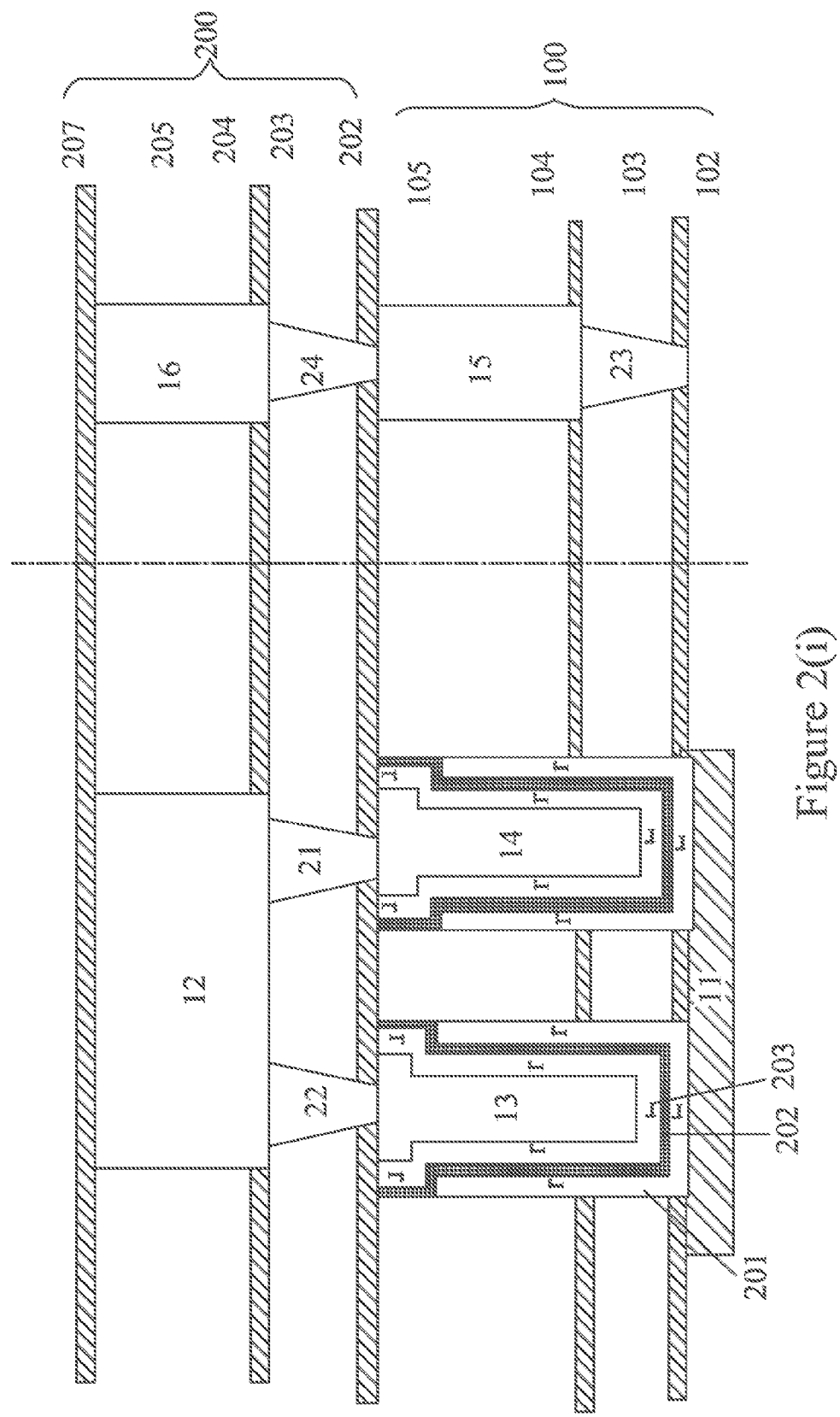

Afterwards, the metal contact 12 used as to the top plate for the MIM capacitor and metal contact 16 for normal logic part of the circuit, and vias 21, 22, and 24 connecting to the metal contacts 13, 14, and 15 are formed using dual damascene Cu process, as shown in FIG. 2(i). The processes for forming via and metal openings, commonly referred to as damascene or dual damascene process, are well known to those skilled in the art and hence are not repeated herein.

Further illustrative embodiments of MIM capacitors may be formed among three adjacent metal layers of a chip which have two thick IMD layers, e.g., 10 KÅ~30 KÅ, separating the three adjacent metal layers, as shown in FIG. 3(a)-(h), wherein the bottom electrode may be formed surrounding a plurality of via and metal contacts made during the normal logic fabrication process for a circuit. The three adjacent metal layers with a thick IMD layer may illustratively be the top three metal layers of an IC, next to the final passivation layer, so that so formed MIM capacitors have high capacitance density and do not change any film scheme of CMOS logic process and therefore have no spice model shift.

Figure 3A:
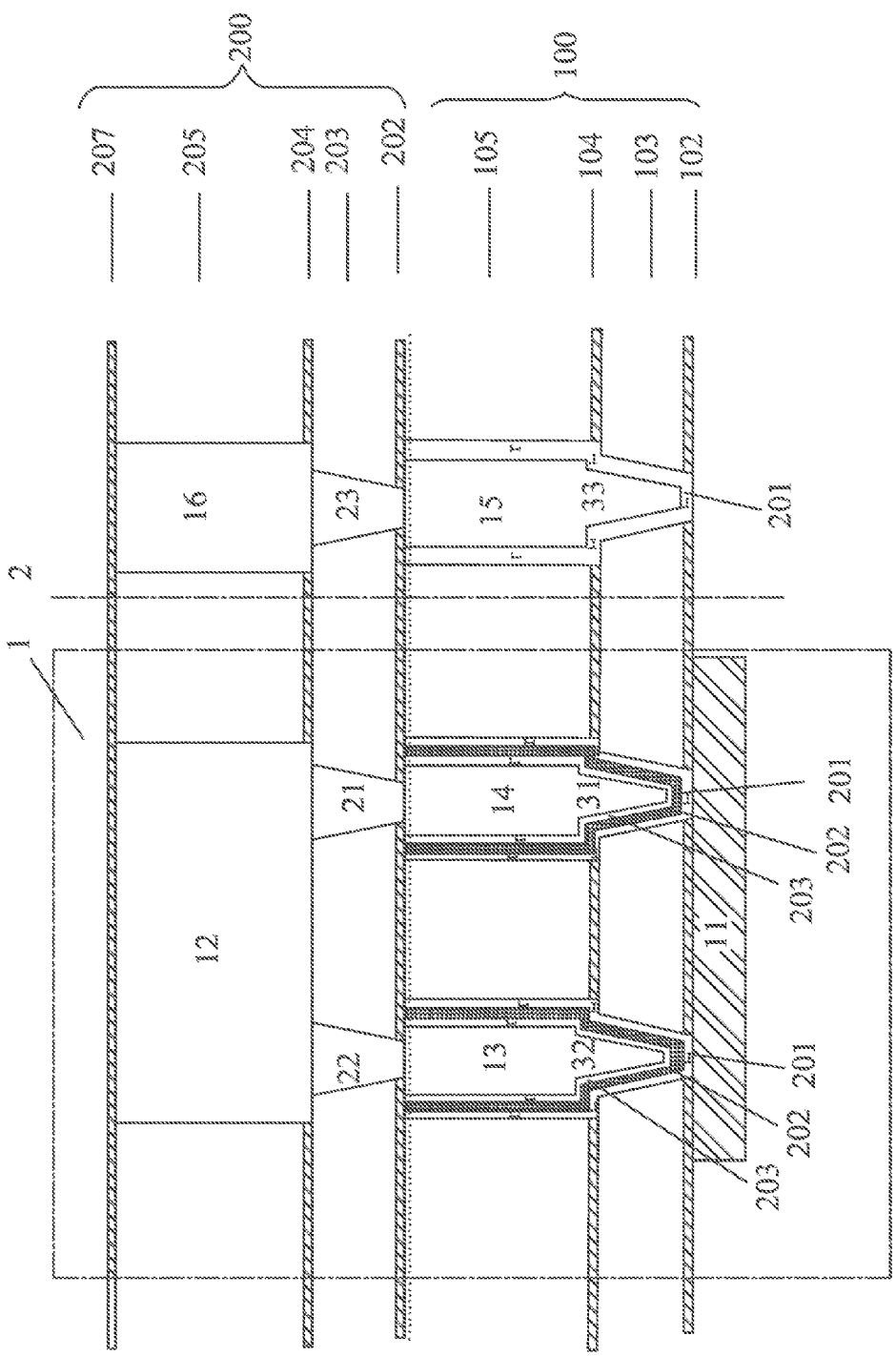

FIG. 3(a) illustrates another exemplary MIM capacitor 1 formed together with other logic 2 of a circuit by a process shown in FIG. 3(b)-(h). The MIM capacitor 1 is formed within the IMD layers 200 and 100 which separate three metal layers. The MIM capacitor 1 may comprise a bottom electrode 201 and upper electrode 203 formed of TaN or TiN, and an intervening high-k dielectric material 202. A bottom electrode pick-up 11 is formed in a first metal layer and a top electrode pick-up 12 is formed in a second metal layer. Advantageously, the second metal layer is the topmost and the first metal layer is two layers down from the topmost metal layer because these metal layers have a sufficiently thick inter-metal dielectric (IMD) layer which allows for the MIM capacitor to be manufactured therein, without adding additional IMD sub-layers, relative to the standard logic CMOS process flow. Many kinds of materials (Si3N4, ZrO2, HfO2, BST . . . etc.) can be used as the dielectric material 202 of the MIM capacitor.

FIG. 3(a) is only for illustrative purposes and is not limiting. For example, there may be more than one MIM capacitor so formed by the illustrative process. The size and position of the metal contacts 11, 12, 13, 14, 15, and 16, are for illustrative purposes and are not limiting. There may be more than two metal contacts in the logic part rather than the metal contacts 15 and 16 as shown. The size of each sub-layer such as 102, 103, 104, 105, 202-207 are only for illustrative purposes and is not limiting. The MIM capacitor 1 may be of different shapes such as cylindrical shape, or a concave shape. There may be one bottom electrode 201 and one top electrode 203 rather than two 201 and 203 as shown.

Still referring to FIG. 3(a), the bottom electrode 201, the dielectric material 202, and the top electrode 203 are embedded within an IMD layer 100 comprising: a stop sub-layer 102 used to prevent Cu out diffusion and also as a via etching stop layer and may be formed by SIC or SIN material; a first IMD sub-layer 103 formed of dielectric insulating layers such as silicon oxide based doped or un-doped materials, but preferably undoped silicate glass (USG) for enhanced structural stability, or fluorinated silicate glass (FSG) for structural stability; a second stop sub-layer 104 to prevent Cu out diffusion and also as a via etching stop layer; a second IMD sub-layer 105.

The MIM capacitor 1 in FIG. 3(a) may be fabricated by an illustrative process shown in FIG. 3(b)-(h). In FIG. 3(b), the illustrative process starts with forming a metal contact 11 (sometimes also referred to as a bottom electrode pick-up) at the metal layer two layers down from the top metal layer; continues with forming a first stop layer 102 by depositing SiC or SIN material. A first IMD sub-layer 103 is formed by depositing IMD materials such as USG oxide film, followed by forming a second stop sub-layer 104 by depositing Sic or SIN materials. Next a second IMD sub-layer 105 is formed by depositing materials such as USG oxide film. Those sub-layers 102, 103, 104, 105 are part of the IMD layer 100 between the two metal layers next to the topmost metal layer, and they are deposited by methods including LPCVD, PECVD, or HDP-CVD. An advantageous feature of the present embodiment is that IMD layer 100 (comprising etch stop layer 102 and 104 and dielectric layers 103 and 105) is a standard layer that is typically employed in CMOS logic processes. Hence, advantageously, no additional IMD sub-layers or processes are required to integrate the illustrative process into standard CMOS process flows.

FIG. 3(b) illustrates a plurality of openings 2001, 2002, and 2003 formed within the layers 102 to 105, on top of the metal contact 11 by photolithography. The opening 2001, 2002, and 2003 are formed using part of a CMOS back end of line (BEOL) process flow for other non-capacitor logic parts. The openings 2001 and 2002 are in direct contact with the metal contact 11. FIG. 3(b) is a cross-section view, and the openings 2001, 2002, and 2003 may be shaped as a cup (i.e., openings 2001 and 2002 may have a substantially circular shape when seen from above). There may be more than two openings in contact with the metal contact 11 to form a MIM capacitor. The number, the position, the size, the width, and the shape of the openings 2001, 2002, and 2003 are only for illustrative purposes only, but are not limiting.

FIG. 3(c) illustrates bottom electrode material 2011 is deposited at the bottom and along the side wall of the openings 2001, 2002, and 2003, and on top of the surface of the sub-layer 105. The material 2011 deposited at the bottom of the openings 2001 and 2002 is in contact with the metal contact 11 forming an electrical contact path. The material 2011 may be conductive materials such as TaN or TiN, or silicided metal nitride such as TaSiN, TiSiN, and WSiN. There may be multiple sub-layers (not shown) comprising the conductive materials.

FIG. 3(c) further illustrates a layer of capacitor dielectric 2021 is deposited on top of the bottom electrode deposit 2011 at the bottom and along the side wall of the openings 2001, 2002, 2003, and on top of the surface of the sub-layer 105 by means including ALD, LPCVD, PECVD, and ALCVD. The material may include any capacitor dielectric such as $SiO_2$, metal nitrides, such as silicon nitride (e.g., $Si_3N_4$) or high dielectric constant (high-k) materials such as $TiO_2$, $Ta_2O_5$, $ZrO_2$, including rare earth oxides such as $Y_2O_3$, $La_2O_5$, $HfO_2$, and their aluminates and silicates. It will be appreciated that the thickness of the capacitor dielectric layer 2021 varies depending on the dielectric material and the desired capacitance.

Figure 3D:
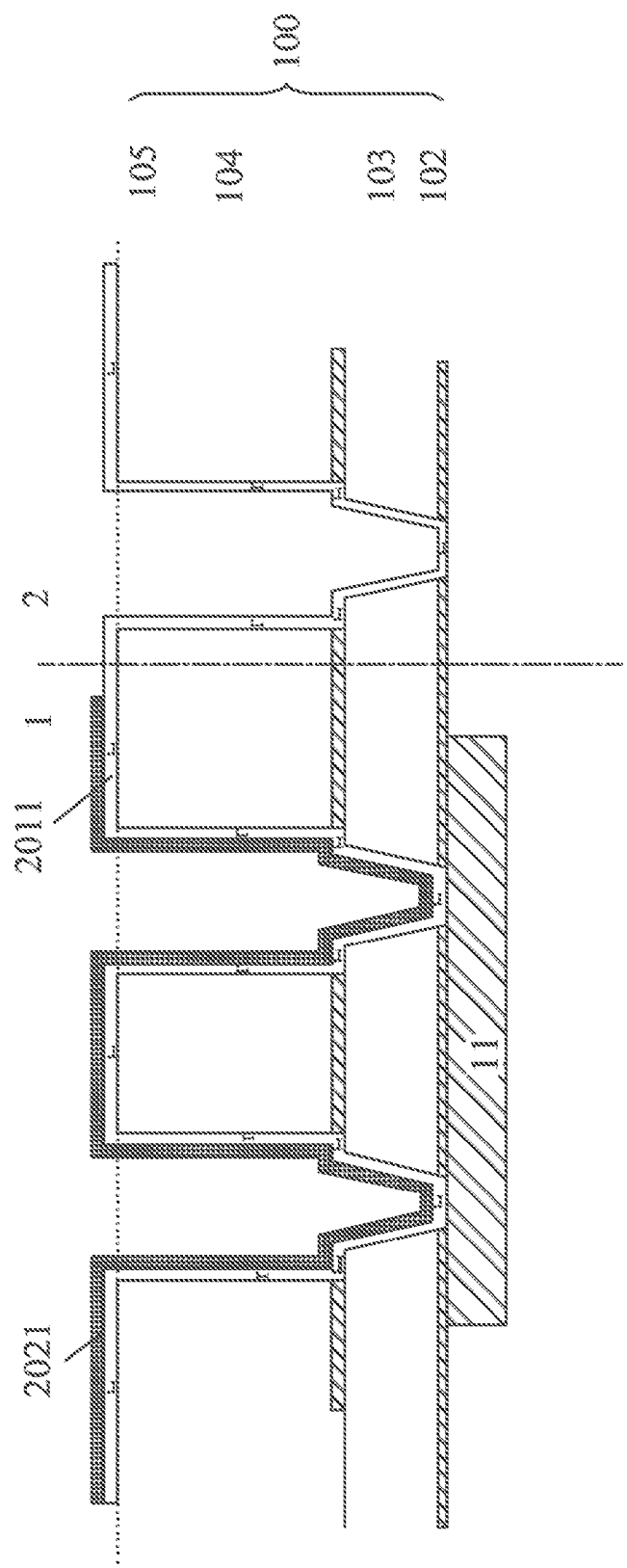
Figure 3E:
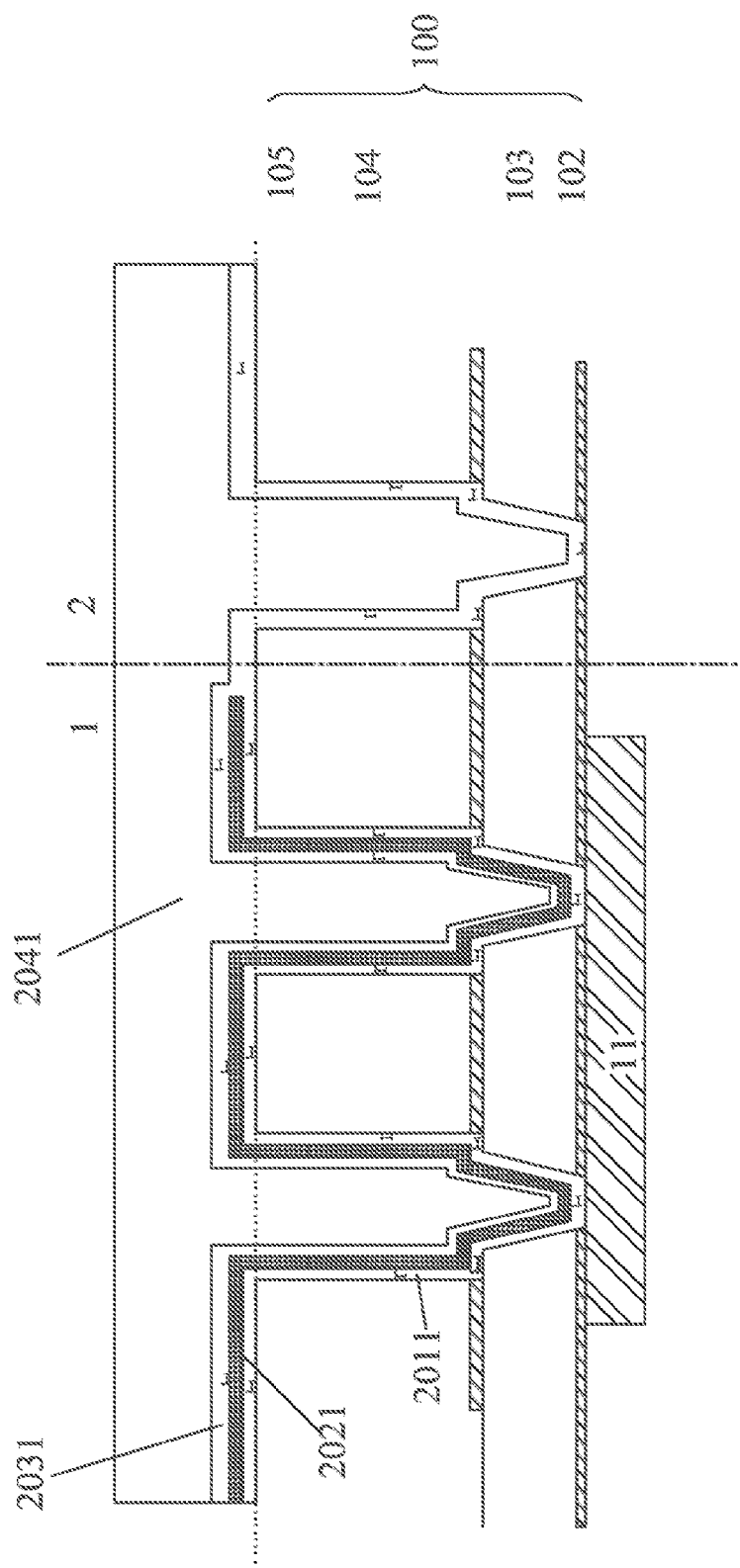

As shown in FIG. 3(d), the dielectric layer 2021 is removed from the non-capacitor logic area of the circuit using a non-critical mask (not shown). Afterwards, a layer of top electrode layer 2031 is then deposited over the capacitor dielectric layer 2021, as shown in FIG. 3(e), by sputter deposition techniques. The upper metal electrode layer 2031 preferably includes at least one conductive layer, for example including the same preferred materials deposited in the bottom electrode material 2011. The overall thickness of the upper electrode layer 2031 is preferably about the same thickness or preferably thinner than the bottom electrode material 2011 thickness, depending on the application. Additional metal material Cu 2041 is used to fill the remaining part of the openings and on top of the top electrode deposit 2031, as shown in FIG. 3(e).

Figure 3F:
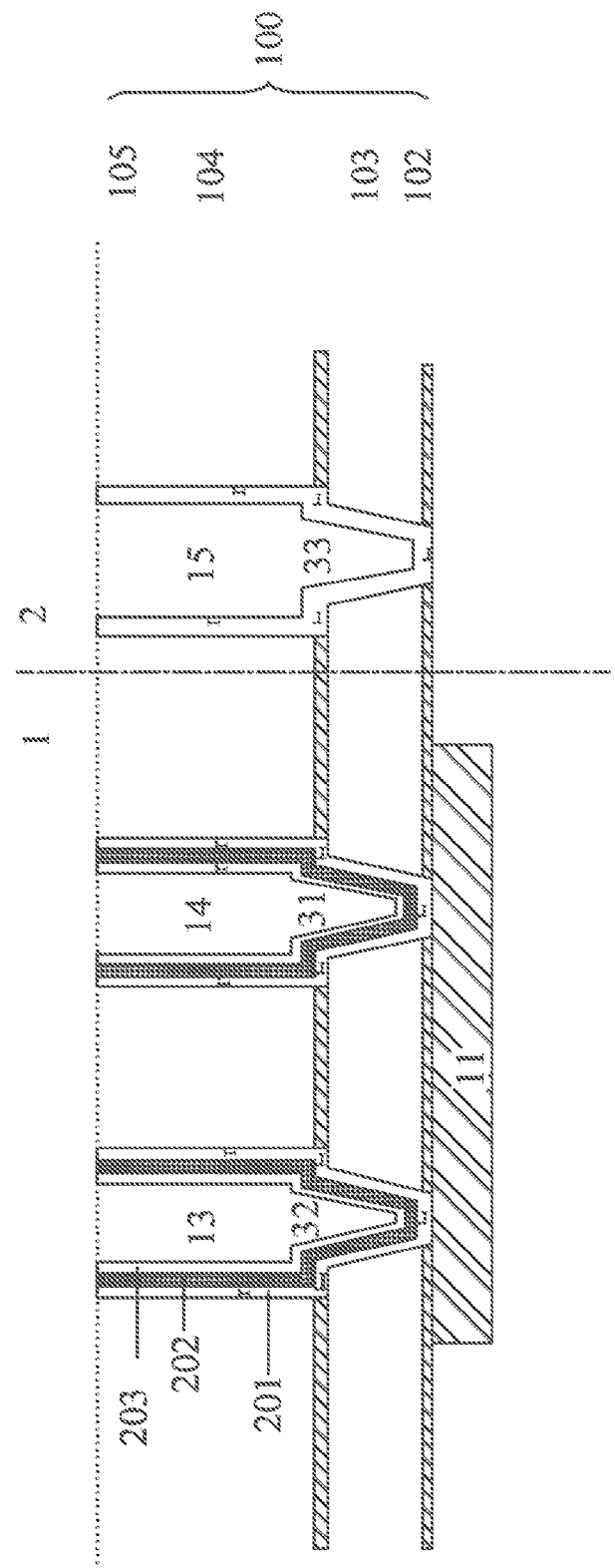

The so formed bottom electrode material 2011, capacitor dielectric 2021 layer, top electrode layer 2031, additional metal material Cu 2041 may be removed by a chemical mechanical planarization (CMP) to form the bottom electrode 201, 202 Hi-k layer, and the 203 top electrode for the MIM capacitor 1 as shown in FIG. 3(f). In addition, metal contacts 13, 14, and 15, and vias 31, 32, and 33 are formed using the damascene or dual damascene process, as shown in FIG. 3(f).

Figure 3G:
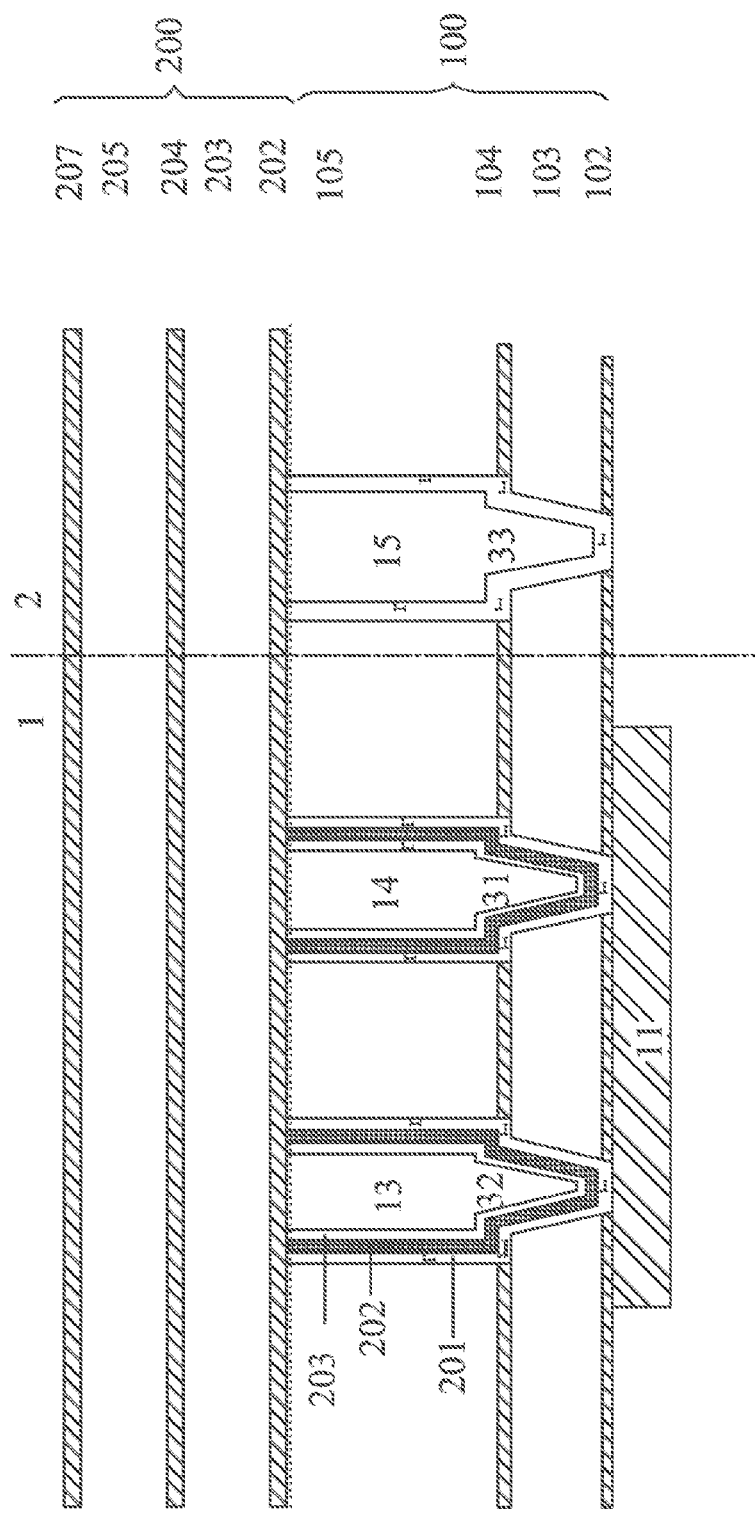

As shown in FIG. 3(g), the process for fabricating the MIM capacitor in FIG. 2 may proceed further by forming the first stop sub-layer 202 of the IMD layer 200, which covers the metal 13, 14, and 15, then forming a sub-layer of IMD 203 by using IMD materials such as USG oxide film; followed by forming a second stop layer 204, another sub-layer of IMD 205, and followed by a sub-layer of stop layer 207, using procedures and materials described previously as for the IMD layer 100.

Figure 3H:
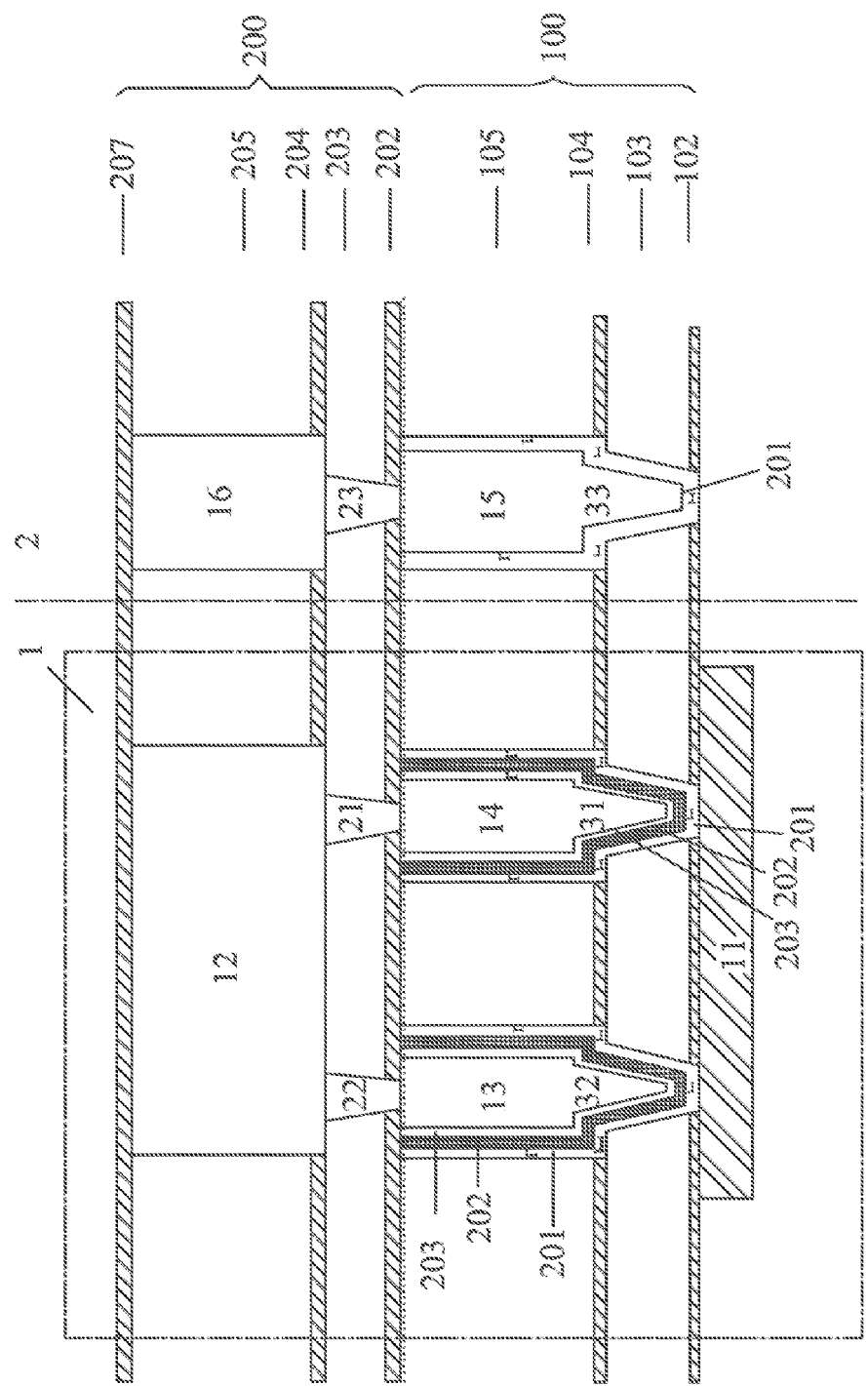

Afterwards, the metal contact 12 used as to the top plate for the MIM capacitor and metal contact 16 for normal logic part of the circuit, and vias 21, 22, and 24 connecting to the metal contacts 13, 14, and 15 are formed using dual damascene Cu process, as shown in FIG. 3(h). The processes for forming via and metal openings, commonly referred to as damascene or dual damascene process, are well known to those skilled in the art and hence are not repeated herein.

Figure 4:
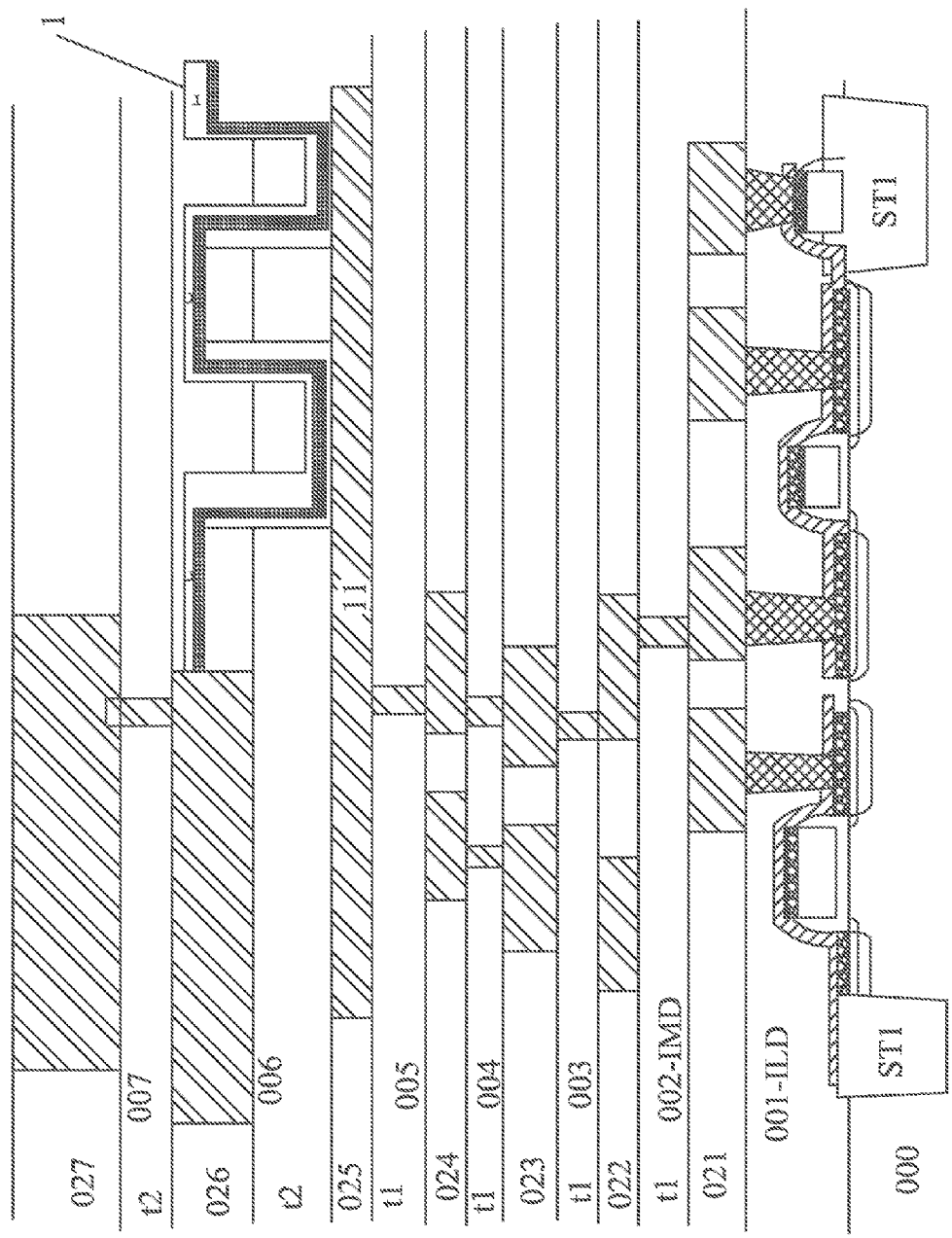
FIG. 4 is an illustrative schematic view of a plurality of metal layers and IMD layers of different thicknesses and an illustrative location where the MIM capacitor may be located among the metal layers.

FIG. 4 is an illustrative schematic view of a plurality of metal layers separated by IMD layers of different thicknesses and an illustrative location where the MIM capacitor bottom plate 11 may be located among the metal layers. The bottom layer 000 of FIG. 4 is the substrate layer where a plurality of drain and sources regions of transistors are formed. On top of the layer 000 is a layer 001 which is the first inter-layer dielectric (ILD) between a first metal layer and the bottom layer. On top of the layer 001 ILD is a first metal layer 021, where a plurality of metal contacts are located and connected to the devices within the bottom layer by vias through the ILD layer 001. A second metal layer 022 is located on top of the first metal layer 021 separated by an inter-metal dielectric (IMD) layer 002. Similarly, additional metal layers 023, 024, 025, 026, and 027 are formed on top of each other and separated by IMD layers 002, 003, 004, 005, 006, and 007 respectively. The number of metal layers 021 to 027 is only for illustrative purposes and are not limiting. There could be other number of layers that is more or less than the 7 metal layers shown in FIG. 4. Among the metal layers shown in FIG. 4, there may be different thickness of the IMD layers separating them. For illustrative purposes, the IMD layers 002, 003, 004, and 005 shown in FIG. 4 are of a first thickness t1, and the IMD layers 006 and 007 are of a second thickness t2. It is known in the art that the IMD layers on top levels may be thicker than the IMD layers at the lower levels due to the increasing currents passing through the top levels of metal layers. Therefore the thickness t2 may be bigger than the thickness t1. For example, the thickness t1 may be in the range of 1 KÅ to 4 KÅ and the thickness t2 is in the range of 10 KÅ to 30 KÅ. The bottom plate 11 of a MIM capacitor 1 may be located in a first metal layer that is on top of a thinner IMD layer. The MIM capacitor 1 shown in FIG. 4 is only for illustration purpose and is not limiting. The MIM capacitor 1 is similar to the MIM capacitor disclosed in FIG. 1. Other forms of MIM capacitors such as disclosed in FIG. 2 or 3 may be illustrated in similar positions in FIG. 4. Illustratively shown in FIG. 4, the bottom plate 11 is at the metal layer 025, which is on top of the thinner IMD layer 005 of thickness t1. The IMD layer 006 on top of the bottom plate 11 is of a different thickness t2. The bottom plate 11 may be placed on metal layer 026 as well, as long as there is a thick IMD layer t2 on top of the bottom plate 11, and there are enough metal layers on top of the bottom plate 11 to form the top plate for the MIM capacitor as demonstrated in previous illustrative embodiments and shown in FIGS. 1 to 3.

The present disclosure has described many exemplary embodiments of methods of fabricating metal-insulator-metal (MIM) capacitors and MIM capacitors fabricated by the methods. Embodiments in the disclosure are only for illustrative purposes and are not limiting. The processes disclosed may be varied according to needs and the available technology at the time and still within the scope of the disclosure. The structure of the MIM capacitors may be varied and still within the scope of the disclosure.

What is claimed is:

1. A metal-insulator-metal (MIM) capacitor within an integrated circuit (IC) comprising:
    a bottom plate in a first metal layer of the IC on top of a first inter-metal dielectric (IMD) layer with a first thickness;
    a bottom electrode, formed in a second IMD layer with a second thickness greater than the first thickness, and formed on top of the first metal layer;
    a dielectric layer adjacent to the bottom electrode within the second IMD layer;
    a top electrode adjacent to the dielectric layer within the second IMD layer;
    a top plate in a second metal layer connected to the top electrode;
    a third metal layer disposed between the first metal layer and the second metal layer; and
    a metal element in the third metal layer, wherein the top electrode is connected to the metal element, and wherein the metal element is laterally spaced apart from the bottom electrode.

2. The MIM capacitor of claim 1, further comprising: a logic circuit element having a contact disposed in the second metal layer.

3. The MIM capacitor of claim 1, wherein:
    the first thickness is in a range of 1 KÅ to 4 KÅ and the second thickness is in a range of 10 KÅ to 30 KÅ.

4. The MIM capacitor of claim 1, wherein:
    the bottom electrode is made of TaN or TiN;
    the dielectric layer is formed by high dielectric constant materials; and
    the top electrode is made of TaN or TiN.

5. The MIM capacitor of claim 1, wherein:
    the top plate is connected to the metal element by a via between the second metal layer and the third metal layer; and
    the top plate is connected to the top electrode through the via and the metal element.

6. The MIM capacitor of claim 5, wherein:
    the third metal layer is on top of the first metal layer and is separated from the first metal layer by the second IMD layer; and
    the second metal layer is on top of the third metal layer separated by a third IMD layer with a thickness similar to the second thickness.

7. A structure, comprising:
    a plurality of intermetal dielectric (IMD) layers disposed over a substrate, lower IMD layers of the plurality of IMD layers, each of the lower IMD layers having a first thickness, and upper IMD layers of the plurality of IMD layers disposed over the lower IMD layers, and each of the upper IMD layers having a second thickness greater than the first thickness;
    a plurality of metal layers, each of the plurality of metal layers disposed over a respective one of the plurality of IMD layers, each of the plurality of IMD layers separated from adjacent ones of the plurality of IMD layers by at least one of the plurality of metal layers, the plurality of metal layers comprising:
        a first metal layer of the plurality of metal layers disposed over a first upper IMD layer;
        a second metal layer of the plurality of metal layers disposed between the first upper IMD layer and a second upper IMD layer disposed below the first upper IMD layer; and
        a third metal layer of the plurality of metal layers disposed between the upper IMD layers and the lower IMD layers; and
    a metal-insulator-metal (MIM) capacitor having a topmost surface disposed in the second upper IMD layer, a bottommost surface of the MIM capacitor extending to the topmost surface of the third metal layer.

8. The structure of claim 7, further comprising a bottom plate disposed in the third metal layer and in contact with a bottom surface of a bottom electrode of the MIM capacitor.

9. The structure of claim 8, further comprising a top plate disposed in the first metal layer and electrically connected to a top electrode of the MIM capacitor, the top electrode electrically insulated from the bottom electrode by a capacitor dielectric.

10. The structure of claim 9, further comprising a via disposed in the first upper IMD layer, the via contacting the top plate and electrically connecting the top plate to the top electrode.

11. The structure of claim 10, further comprising a first metal contact disposed in a recess in, and in contact with, the top electrode, wherein the via contacts the first metal contact, and wherein the top electrode is electrically connected to the top plate through the via and the first metal contact.

12. The structure of claim 11, wherein the topmost surface of the MIM capacitor is substantially level with the topmost surface of the second metal layer.

13. The structure of claim 10, further comprising a second metal contact formed in the second metal layer and laterally adjacent to the MIM capacitor, wherein the second metal contact is in contact with the top electrode and the via, and where the top electrode is electrically connected to the top plate through the second metal contact and via.

14. The structure of claim 13, wherein the topmost surface of the MIM capacitor is disposed below a topmost surface of the second metal layer and above a bottommost surface of the second metal layer, at least a portion of a dielectric material of the second metal layer disposed between the topmost surface of the second metal layer and the topmost surface of the MIM capacitor.

15. A structure, comprising:
    a plurality of lower intermetal dielectric (IMD) layers disposed over a substrate, and each having a first thickness;
    a plurality of upper IMD layers disposed over the plurality of lower IMD layers and each having a second thickness greater than the first thickness;
    a first metal layer over a topmost upper IMD layer;
    a second metal layer disposed between the topmost upper IMD layer of the plurality of upper IMD layers and a second upper IMD layer of the plurality of upper IMD layers disposed below the topmost upper IMD layer;

a third metal layer disposed below the plurality of upper IMD layers;

a metal-insulator-metal (MIM) capacitor disposed in the second upper IMD layer, and extending at least to a topmost surface of the third metal layer; and a metal contact formed in the second metal layer, the metal contact being laterally adjacent to and not directly over the MIM capacitor, wherein the metal contact is in contact with a top electrode of the MIM capacitor.

16. The structure of claim 15, further comprising a bottom plate disposed in the third metal layer and in contact with a bottom surface of a bottom electrode of the MIM capacitor, the top electrode electrically insulated from the bottom electrode by a capacitor dielectric.

17. The structure of claim 15, further comprising a top plate disposed in the first metal layer and electrically connected to the top electrode through the metal contact.

18. The structure of claim 17, further comprising a via disposed in the topmost upper IMD layer, the via contacting the top plate and electrically connecting the top plate to the top electrode.

19. The structure of claim 15, wherein the topmost surface of the MIM capacitor is disposed below a topmost surface of the second metal layer and above a bottommost surface of the second metal layer, at least a portion of a dielectric material of the second metal layer disposed between the topmost surface of the second metal layer and the topmost surface of the MIM capacitor.

20. The structure of claim 15, further comprising an interlayer dielectric (ILD) layer disposed between the substrate and a bottommost IMD layer of the lower IMD layers.

* * * * *